United States Patent
Park et al.

(10) Patent No.: US 7,164,615 B2
(45) Date of Patent: Jan. 16, 2007

(54) SEMICONDUCTOR MEMORY DEVICE PERFORMING AUTO REFRESH IN THE SELF REFRESH MODE

(75) Inventors: Taek-Seon Park, Gyeonggi-do (KR); Yun-Sang Lee, Gyeonggi-do (KR); Jung-Bae Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 11 days.

(21) Appl. No.: 11/169,241

(22) Filed: Jun. 27, 2005

(65) Prior Publication Data

US 2006/0018174 A1    Jan. 26, 2006

(30) Foreign Application Priority Data

Jul. 21, 2004    (KR) .................. 10-2004-0056967

(51) Int. Cl.
    *G11C 7/00*    (2006.01)
(52) U.S. Cl. .................. 365/222; 365/230.08; 365/233
(58) Field of Classification Search ................ 365/222, 365/230.03, 233, 229, 230.08, 189.05
    See application file for complete search history.

(56) References Cited

U.S. PATENT DOCUMENTS

| 5,627,791 | A | 5/1997 | Wright et al. |
| 6,046,953 | A | 4/2000 | Kiehl et al. |
| 6,178,130 | B1 * | 1/2001 | Tsern et al. .................. 365/222 |
| 6,256,255 | B1 * | 7/2001 | Keeth et al. ........... 365/230.03 |
| 6,859,407 | B1 * | 2/2005 | Suh ............................ 365/222 |
| 6,928,019 | B1 * | 8/2005 | Lee ............................ 365/222 |

* cited by examiner

*Primary Examiner*—Richard Elms
*Assistant Examiner*—Hien Nguyen
(74) *Attorney, Agent, or Firm*—Marger Johnson & McCollom, P.C.

(57) ABSTRACT

Method and apparatus for use with multi-bank Synchronous Dynamic Random Access Memory (SDRAM) circuits, modules, and memory systems are disclosed. In one described embodiment, an SDRAM circuit receives a bank address to be used in an auto-refresh operation, and performs the auto-refresh operation on the specified bank and for a current refresh row. The device is allowed to enter a self-refresh mode before auto-refresh operations have been completed for all banks and the current refresh row. The memory device completes refresh operations for the current refresh row before proceeding to perform self-refresh operations for new rows. Other embodiments are described and claimed.

42 Claims, 23 Drawing Sheets

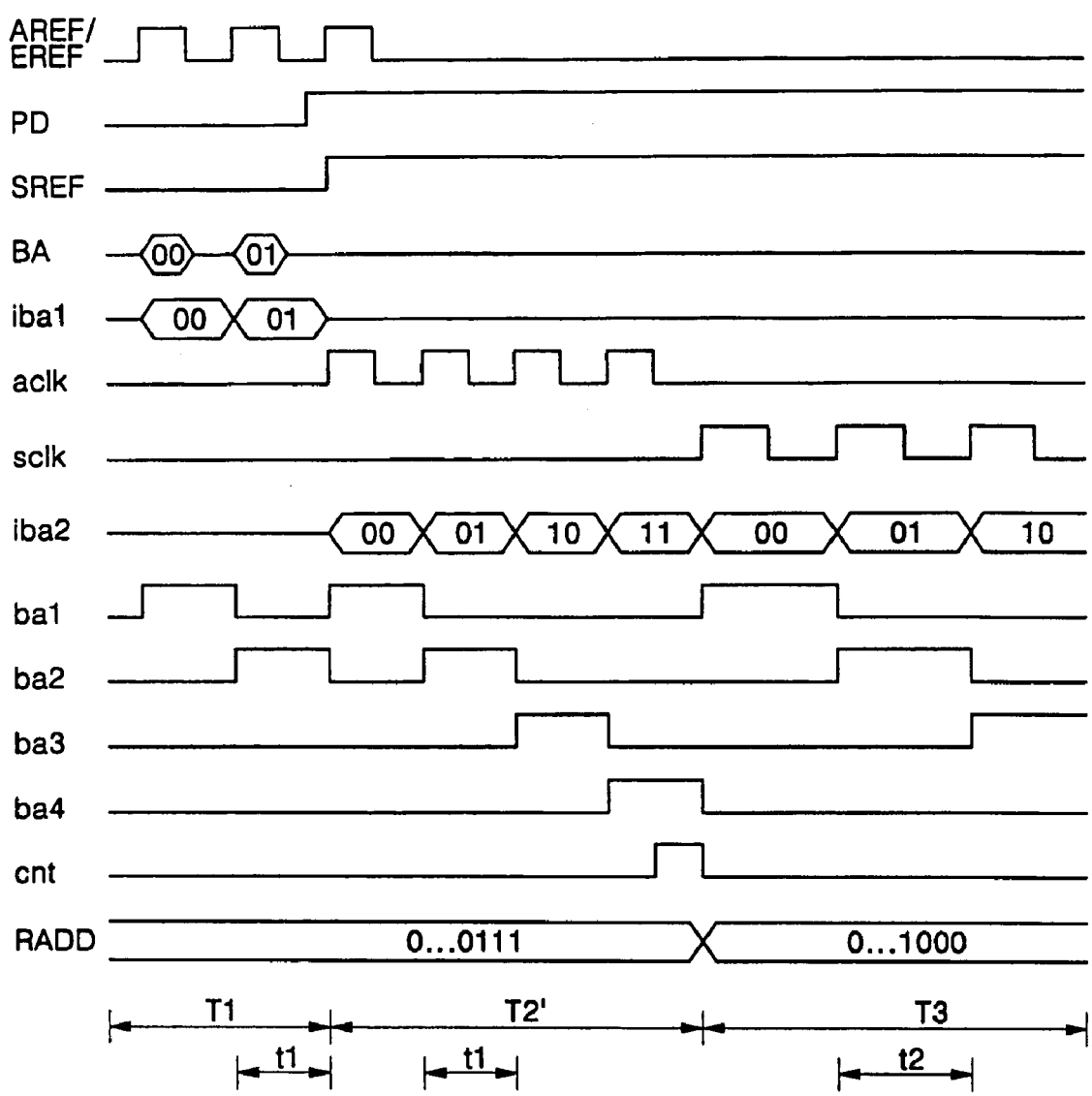

SEMICONDUCTOR MEMORY DEVICE PERFORMING AUTO REFRESH IN THE SELF REFRESH MODE

RELATED APPLICATIONS

This application claims the benefit of priority to Korean Patent Application 2004-56967, filed on Jul. 21, 2004, the disclosure of which is incorporated herein by reference.

BACKGROUND OF THE INVENTION

1. Field of the Invention

The present invention relates to dynamic random access memory (DRAM) semiconductor devices and systems, and more particularly to methods and apparatus for transitioning to a self-refresh mode in a device that performs per-bank auto-refresh operations.

2. Description of the Related Art

DRAM devices are well known and commonly found in digital systems having a need for read/write digital memory. DRAM devices are so-named because the data in each memory cell must be refreshed periodically by reading the data, or else the stored data will be corrupted. Modern synchronous DRAM devices (SDRAMs) typically employ an "auto-refresh" mode, which refreshes one row of the DRAM memory cell array each time an auto-refresh operation is initiated by an external memory controller. An internal refresh row counter increments through the rows for successive auto-refresh operations, and wraps back to the top of the array upon reaching the bottom. The DRAM memory controller thus has some flexibility as to when it issues the auto-refresh commands to a DRAM device, as long as all rows are refreshed within the maximum time specified for the array to maintain stable data.

Many SDRAM devices contain multiple banks of memory, with the high-order row address bits supplied to the SDRAM along with an operation determining which bank is to receive the operation. Some of these devices allow a bank address to be supplied with an auto-refresh command, and then an auto-refresh operation is performed in the bank specified by the bank address with regard to the current refresh row while a data access operation may be performed in the unselected banks at the same time. Such devices will be referred to herein as Per-Bank Refresh (PBR) SDRAM devices. The inventor of the present application has filed a copending application, U.S. Pat. application Ser. No. 11/105,169, disclosing novel PBR SDRAM architectures and methods of operation, the disclosure of which is incorporated herein by reference.

Many SDRAM devices also incorporate a "self-refresh" mode. In self-refresh mode, the SDRAM device generally enters a lower-power state during which it does not respond to bus commands until awakened. In self-refresh mode, the SDRAM device is expected to perform its own refresh operations, based on internal timing, sufficient to retain data saved in the memory device.

SUMMARY OF THE INVENTION

It has now been recognized that at least some PBR SDRAM devices can benefit from a self-refresh mode that incorporates logic for transitioning to self-refresh mode at any point in an auto-refresh cycle, whether all banks have been refreshed for the current refresh row or not. Possible benefits include lessening the device-specific requirements on the memory controller, increasing the flexibility of the memory device, and allowing less critical timing for transitions to self-refresh mode.

In one aspect of the present disclosure, a method of operating a multibank memory device is disclosed. The method comprises receiving an external refresh bank address, and performing an auto-refresh operation on a current row of a memory cell array bank corresponding to the external refresh bank address. The device responds to a power-down command by entering a self-refresh mode. Prior to updating the current row to a new row for the first time in self-refresh mode, the device completes auto-refresh operations (if necessary) for the current row in all memory cell array banks, e.g., by refreshing the current row in the banks that have not had a refresh operation performed on the current row, or by refreshing all banks for the current row, even if one or more of those banks have been auto-refreshed prior to entering self-refresh mode. Several embodiments are presented for completing refresh operations for the current row.

In another aspect of the present disclosure, a synchronous memory device is disclosed. The memory device comprises a plurality n of independently addressable memory cell array banks, a refresh address generator to specify a current refresh row to all memory cell array banks, and bank address circuitry to receive an externally supplied bank address for a refresh operation and apply the refresh operation to the memory cell array bank corresponding to the bank address. A refresh bank address counter signals the refresh address generator to generate a new refresh row when refresh operations have been addressed to the current refresh row in each of the plurality of memory cell array banks. Self-refresh circuitry applies refresh operations to the memory cell array banks in a self-refresh mode, the self-refresh circuitry comprising circuitry to complete refresh operations for the current refresh row in all memory cell array banks upon entering self-refresh mode and before updating the current refresh row to a new row. The self-refresh circuitry can function according to several more specific embodiments, which will be further detailed below.

Other aspects disclosed include memory controllers, memory modules, and memory systems useful with the disclosed memory devices.

BRIEF DESCRIPTION OF THE DRAWINGS

FIG. 5 contains an alternate timing diagram showing an auto-refresh-to-self-refresh transition for the SDRAM device of FIGS. 1A and 1B;

DETAILED DESCRIPTION OF THE EMBODIMENTS

Figure 1A:
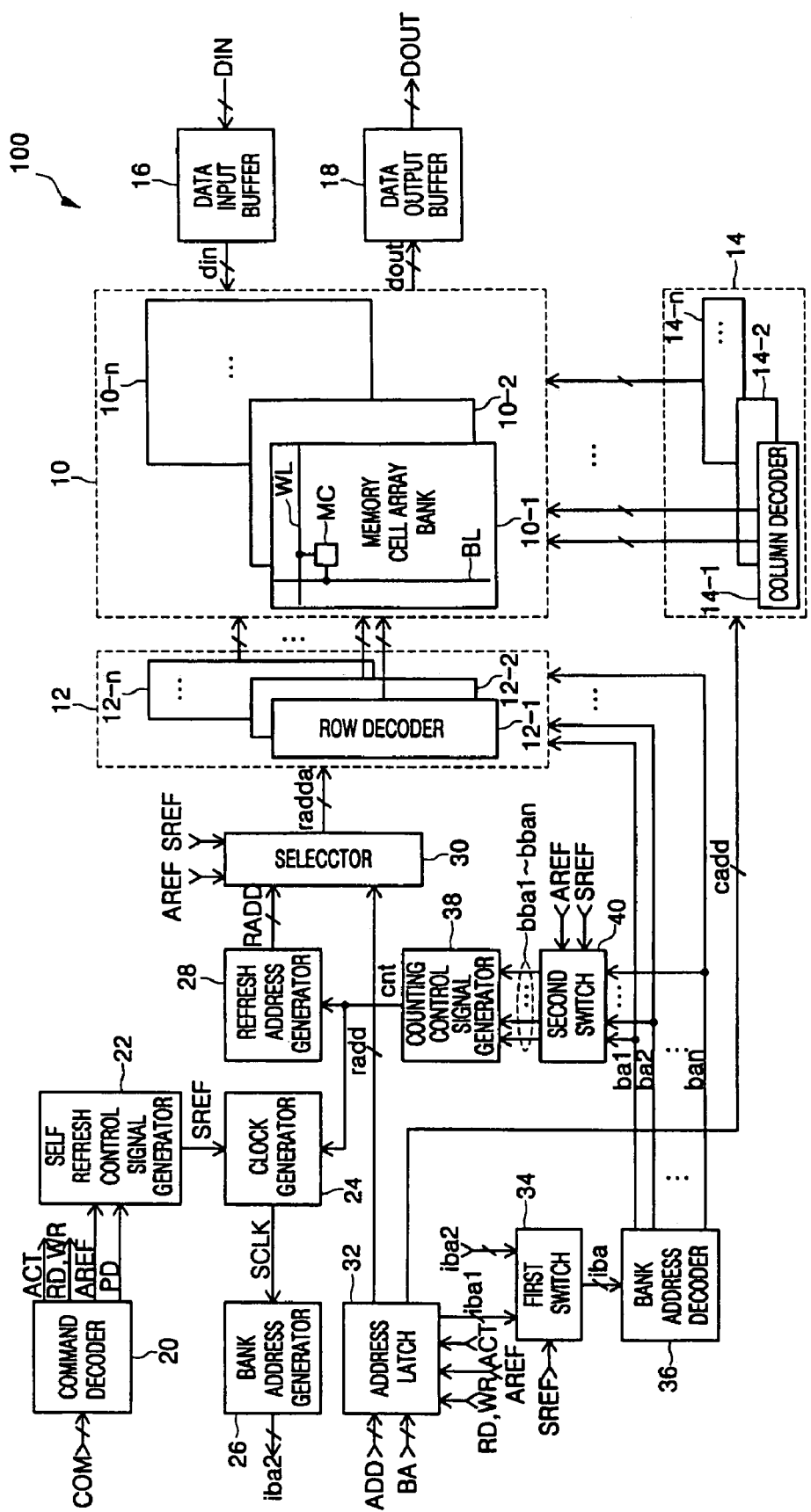
FIGS. 1A and 1B illustrate in block diagram form, respectively, decoded auto-refresh and external auto-refresh signal versions of a synchronous dynamic random access memory (SDRAM) device according to a first embodiment.

FIG. 1A shows a SDRAM device 100 in block diagram form. A memory cell array 10 comprises a plurality of memory cell array banks 10-1 to 10-n, where n can be any number larger than 1, and is typically a power of 2. Each bank comprises a plurality of memory cells MC, each connected to a unique combination of one of a plurality of bit lines BL and one of a plurality of word lines WL, as is known in the art.

A row address decoder circuit 12 selects one of main word lines for each memory operation based on a supplied row address radda. Each of the main word lines couples to a plurality of word lines (WLs) through a control circuit (not shown). Row address decoder circuit 12 comprises a plurality of row address decoders 12-1 to 12-n, each activating word lines in a respective one of the memory cell array banks 10-1 to 10-n. A plurality of bank select signals ba1 to ban determines which of the row address decoders responds to row address radda.

A column address decoder circuit 14 selects the bit line(s) that will be read/written during memory read/write operations, based on a column address cadd. Column address decoder circuit 14 comprises a plurality of column address decoders 14-1 to 14-n, each reading bit lines in a respective one of the memory cell array banks 10-1 to 10-n.

A refresh address generator 28 receives a count signal cnt when a new refresh row address should be generated. Refresh address generator 28 supplies a current refresh row address RADD to a selector 30.

An address latch 32 receives a plurality of external address signals ADD and a plurality of external bank address signals BA. An auto-refresh command signal AREF, an Active (ACT) signal, Write (WR) signal, and Read (RD) signal determine how ADD and BA are interpreted. During an active command, the ADD signals are latched and supplied as a row address radd to selector 30, and the BA signals are latched and supplied as a bank address iba1 to a first switch 34. During a read or write command, the ADD signals (and possibly the BA signals as well) are latched and supplied as column address cadd to the column address decoder circuit 14. During an auto-refresh command, the bank address signals BA are latched and supplied as bank address iba1 to the first-switch 34.

A command decoder 20 receives external command signals COM and generates various control signals, including ACT, WR, and RD, AREF, and PD (a power-down signal). When an auto-refresh command and a power-down command are received together, command decoder 20 asserts PD to a self-refresh control signal generator 22.

Self-refresh control signal generator 22 asserts a self-refresh control signal SREF when the device enters self-refresh mode. That is, the device enters self-refresh mode when the power down signal PD is activated. SREF is supplied to several blocks, including first switch 34, a clock generator 24, selector 30, and a second switch 40.

Clock generator 24 generates a refresh clocking signal SCLK when the device is in self-refresh mode and SREF is enabled. SCLK triggers a bank address generator 26 to generate a self-refresh bank address iba2 on every SCLK cycle, e.g., in a predetermined repeating order that sequentially addresses each bank 10-1 to 10-n.

First switch 34 receives iba1 and iba2, and self-refresh control signal SREF. When SREF is not asserted, iba1 is passed through first switch 34 as a bank address iba. When SREF is asserted, iba2 is passed through first switch 34 as bank address iba.

A bank address decoder 36 decodes bank address iba to generate the appropriate bank select signal from the group ba1–ban.

Selector 30 determines whether the current refresh address RADD or the address latch output address radd is passed to row address decoder circuit 12 as row address radda. The auto-refresh command signal AREF and the self-refresh control signal SREF are supplied to selector 30 as the selection signals—when either AREF or SREF is asserted, RADD is selected as address radda to row decoder 12, and otherwise radd is selected.

A second switch 40 passes bank select signals ba1–ban through as buffered bank select signals bba1–bban, respectively, based on auto-refresh command signal AREF or self-refresh control signal SREF. When either AREF or SREF is asserted, second switch 40 replicates each bank select signal onto its corresponding buffered bank select signal line.

A counting control signal generator 38 receives buffered bank select signal lines bba1–bban. When each buffered bank select signal has been asserted for the current refresh row, counting control signal generator 38 asserts a count signal cnt to refresh address generator 28, signaling refresh address generator 28 to update the current refresh row to a new row. As will be described in one optional arrangement of this embodiment, count signal cnt can also be supplied to clock generator 24.

A data input buffer 16 receives data signals DIN from an external data bus when Write signal WR is active, and supplies data signals din to memory array 10. A data output buffer 18 receives data signals dout from memory array 10 when Read signal RD is active, and supplies data signals DOUT to the external data bus.

Figure 1B:
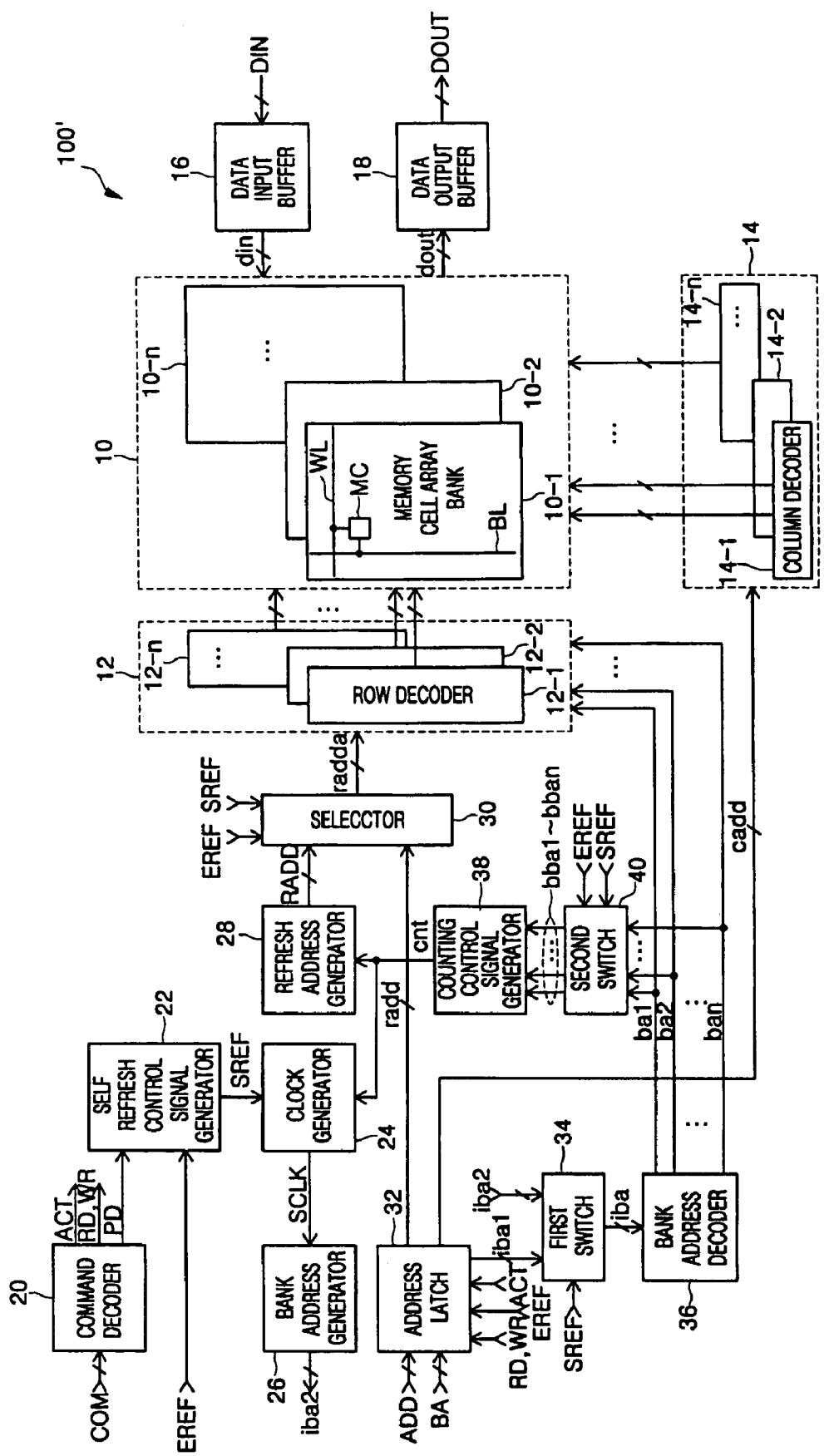

An alternative arrangement SDRAM device 100' is shown in FIG. 1B. SDRAM device 100' is similar to SDRAM device 100, except that a dedicated external refresh signal EREF, instead of a decoded command AREF, determines when an auto-refresh operation is to be performed. The following figures will further illustrate operation of SDRAM devices 100 and 100', assuming AREF and EREF behave similarly.

Figure 2:
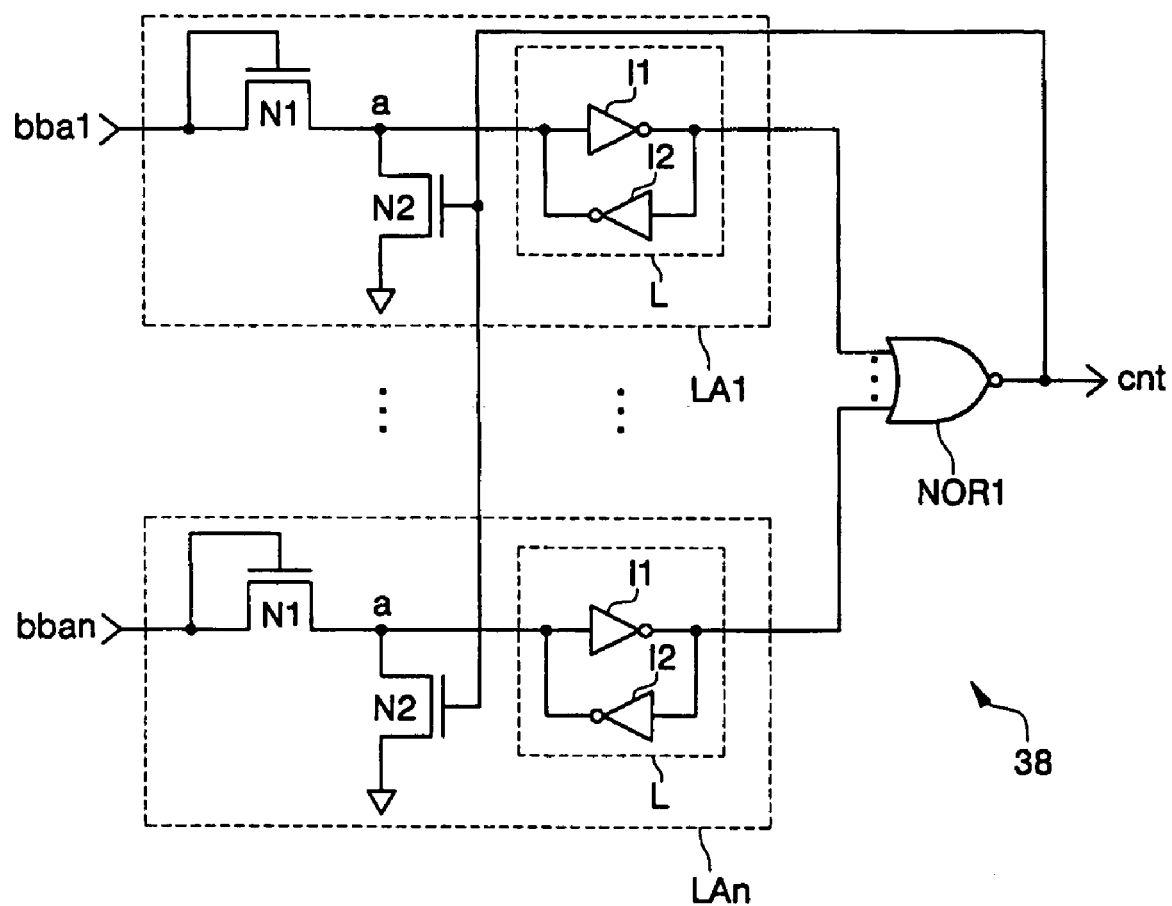
FIG. 2 illustrates a counting control signal generator useful, e.g., in the SDRAM device of FIGS. 1A and 1B.

FIG. 2 shows one embodiment of counting control signal generator 38. Counting control signal generator 38 comprises latch circuits LA1 to LAn, each receiving a corresponding buffered bank address signal bba1 to bban, each providing one input to an n-input NOR gate NOR1. NOR gate NOR1 provides the generator output signal cnt, which also feeds back to each latch circuit as a reset signal.

Each latch circuit comprises two n-channel MOSFET transistors N1 and N2, and a latch L formed from two inverters I1 and I2 connected input-to-output with each other. Transistor N1 acts as an isolation transistor, connecting latch L to the buffered bank address signal when the buffered bank address is asserted. When the buffered bank address is asserted, latch L is forced to a state where the output of the latch circuit is low. Once all buffered bank address signals have been asserted, all inputs to NOR1 will be low, and NOR1 asserts cnt.

In each latch circuit, transistor N2 is connected in a pull-down configuration to the input of latch L, with cnt provided as a gate signal to N2. Thus when cnt is asserted, it forces latch L to a state where the output of the latch circuit is high, resetting counting control signal generator 38 and deasserting cnt.

Figure 3:
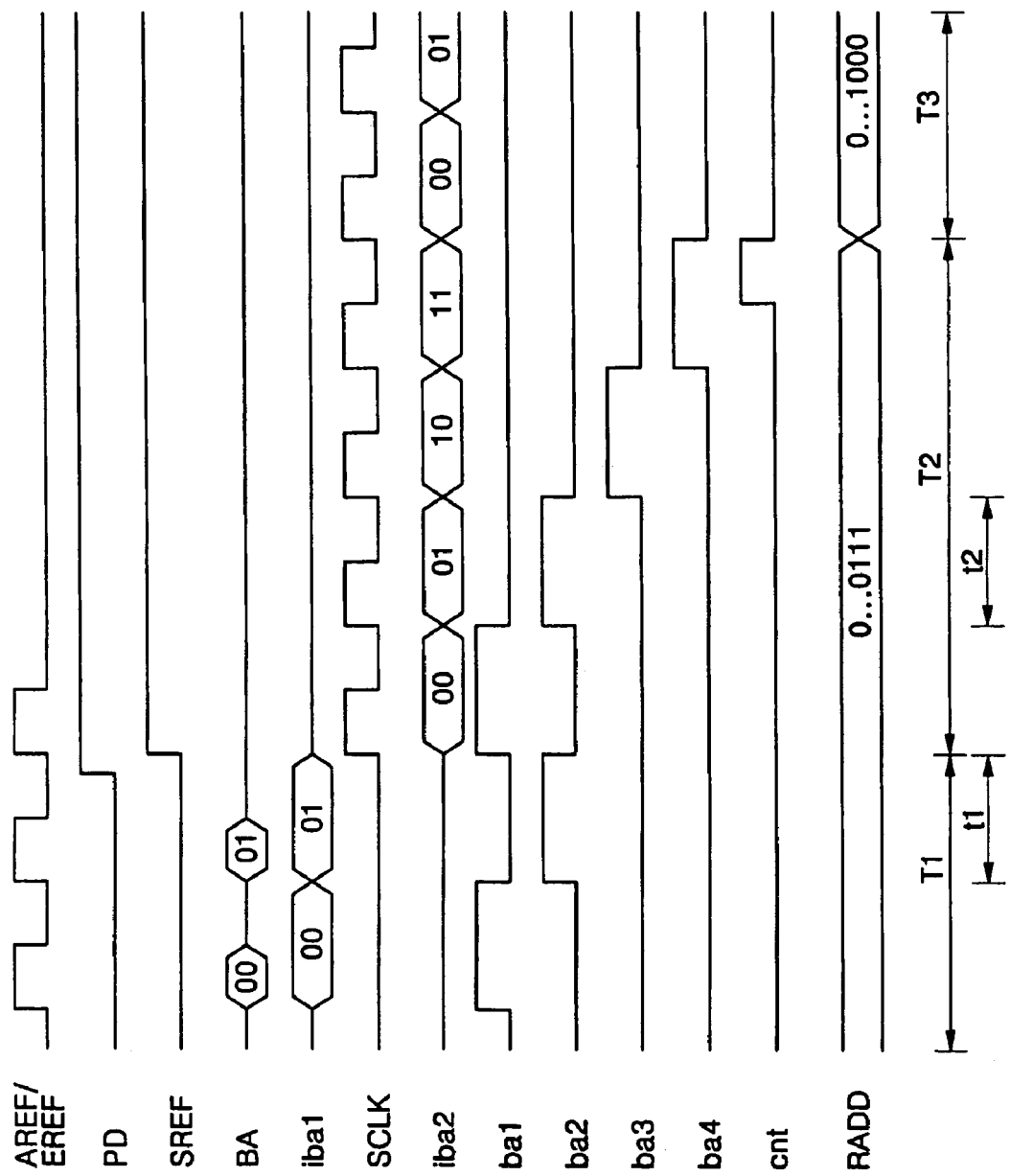
FIG. 3 contains a timing diagram showing an auto-refresh-to-self-refresh transition for the SDRAM device of FIGS. 1A and 1B.

FIG. 3 contains a timing diagram illustrating the operation of SDRAM devices 100 and 100' with the counting control signal generator of FIG. 2, assuming a four-bank memory array with bank addresses 00, 01, 10, and 11. During a time period T1, the memory device is in normal mode, and responds to auto-refresh commands and active mode commands (not shown). Refresh address generator has generated a current refresh row address RADD with a value 0 . . . 0111. During T1, a first auto-refresh command is signaled with a supplied bank address BA equal to 00, which is latched by address latch 32 as internal bank address iba1. Because SREF is low, iba1 is passed to bank address decoder 36, which decodes the value 00 and asserts bank address select signal ba1. The AREF assertion activates second switch 40, causing counting control signal generator 38 to latch bba1. The AREF assertion also causes selector 30 to pass the current refresh row address 0 . . . 0111 to row address decoder 12. As a result, row 0 . . . 0111 in bank 10-1 is refreshed.

Also during T1, a second auto-refresh command is signaled with a supplied bank address BA equal to 01. Through similar responses, counting control signal generator 38 now latches bba2, and row 0 . . . 0111, bank 10-2 is refreshed.

At a third AREF assertion, a power down command is issued, causing the value of PD to move to a logic high state. Self-refresh control signal generator 22 recognizes that the device is being placed in a low-power state, and asserts self-refresh control signal SREF to clock generator 24. This ends time period T1, and begins a time period T2 where the memory device is in a self-refresh mode. Note that at the time self-refresh mode is entered, only two of four banks (banks 10-1 and 10-2) have been refreshed for the current refresh row.

Clock generator 24 responds to the SREF assertion by generating a first SCLK pulse to bank address generator 26. Bank address generator generates a first internal bank address iba2 with a value 00. Because SREF is now high, iba2 is passed to bank address decoder 36, which decodes the value 00 and asserts bank address select signal ba1. The SREF assertion activates second switch 40, causing counting control signal generator 38 to attempt to latch bba1 again (with no effect, since bba1 has already been latched). The SREF assertion also causes selector 30 to pass the current refresh row address 0 . . . 0111 to row address decoder 12. As a result, row 0 . . . 0111 in bank 10-1 is refreshed again, this time in self-refresh mode.

Also during T2, a second SCLK assertion causes bank address generator to advance to a bank address of 01. Through similar responses, counting control signal generator 38 now attempts to latch bba2 again, and row 0 . . . 0111, bank 10-2 is refreshed again.

A third SCLK assertion causes bank address generator 26 to advance to a bank address of 10. Through similar responses, counting control signal generator 38 now latches bba3, and row 0 . . . 0111, bank 10-3 is finally refreshed.

A fourth SCLK assertion causes bank address generator 26 to advance to a bank address of 11. Through similar responses, counting control signal generator 38 now latches bba4, and row 0 . . . 0111, bank 10-4 is finally refreshed.

Note that after four SCLK assertions, the current refresh row 0 . . . 0111 has finally been refreshed in all banks and all four latch circuits in counting control signal generator 38 have latched their respective bank address select signals. This causes counting control signal generator 38 to assert cnt, resetting itself and advancing refresh address generator 28 to the next refresh row address RADD (with a value 0 . . . 1000). A new time period T3 begins, during which the new row address is refreshed in all banks in self-refresh mode.

It can be appreciated from the preceding example that no matter where the auto-refresh operation left off in the current row at the time of the power-down command (and independent of the order banks were addressed in auto-refresh operations for the current row), proper refresh operation is assured for all banks.

Figure 4:
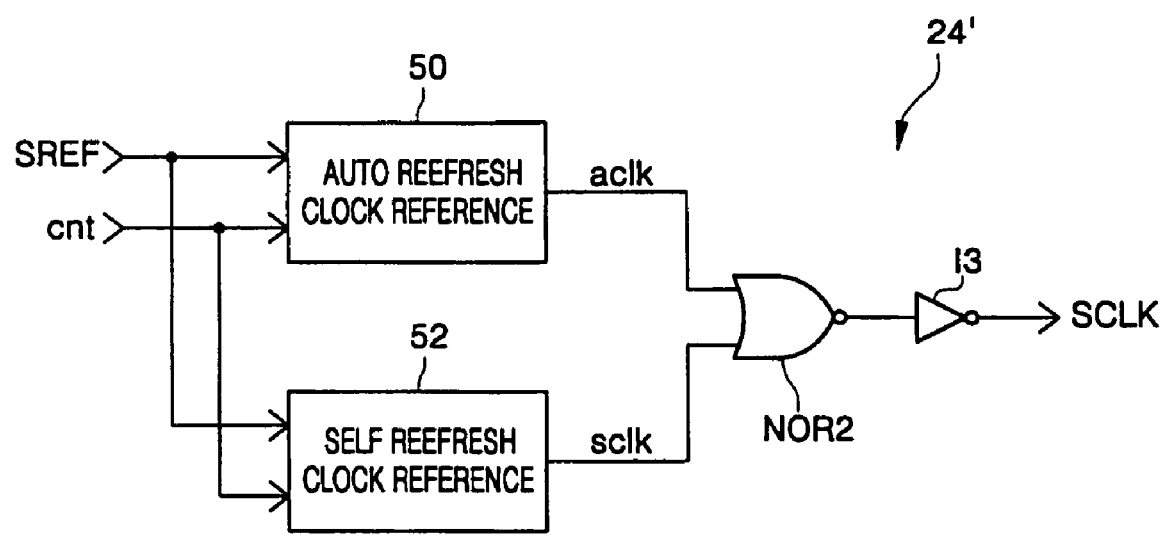
FIG. 4 contains a block diagram for an alternate self-refresh clock generator useful with the SDRAM device of FIGS. 1A and 1B.

Timing-wise, the worst case occurs when a power-down command is received with one bank left to refresh for the current row. Depending on the timing followed by the memory controller, it is possible that the remaining bank is nearing the end of its hold time. FIGS. 4 and 5 illustrate a permutation on the first embodiment that addresses this timing scenario.

FIG. 4 shows an alternate self-refresh clock generator 24', comprising an auto-refresh clock reference 50, a self-refresh clock reference 52, a NOR gate NOR2, and an inverter I3. Clock references 50 and 52 receive self-refresh control signal SREF and count signal cnt. Auto-refresh clock reference 50 is enabled when SREF is asserted, and subsequently disabled the first time cnt is asserted. When enabled, auto-refresh clock reference 50 generates a clocking signal aclk. Self-refresh clock reference 52 is disabled until the first time that SREF and cnt are asserted together, and is then enabled until SREF is deasserted. When enabled, self-refresh clock reference 52 generates a clocking signal sclk.

NOR gate NOR2 receives aclk and sclk, and supplies an output to inverter 13. The output of inverter 13 is the self-refresh clocking signal SCLK. Thus in operation, a positive clock pulse on either aclk or sclk will produce a positive clock pulse on SCLK.

FIG. 5 shows an exemplary timing diagram for the FIGS. 1A/1B embodiment, with the alternate self-refresh clock generator 24'. FIG. 5 follows FIG. 3 until the power-down signal (PD) is asserted at the end of T1. At that point, auto-refresh clock reference 50 is enabled, and generates four consecutive clock pulses, initiating four self-refresh operations. The four self-refresh operations address the four banks successively for the current row address 0 . . . 0111, which was the current row address for auto-refresh operation during time period (T1), just before entering the self-refresh operation. After the four banks have been refreshed, counting control signal generator 38 generates a counting signal cnt to refresh address generator 28 and self-refresh clock generator 24. In response to the cnt pulse, auto-refresh clock reference 50 is disabled and self-refresh clock reference 52 is enabled. Self-refresh clock reference 52 then initiates self-refresh clock cycles during time period T3 and beyond.

The flexibility added by self-refresh clock generator 24' is that the refresh operation for the row 0 . . . 0111 can be completed relatively quickly, and then "normal" self-refresh operations begin on the next refresh row at the standard refresh rate. Comparing FIGS. 3 and 5, the first four self-refresh cycles are completed at a rate t1, and then the following self-refresh cycles occur at a slower rate t2.

Figure 6A:
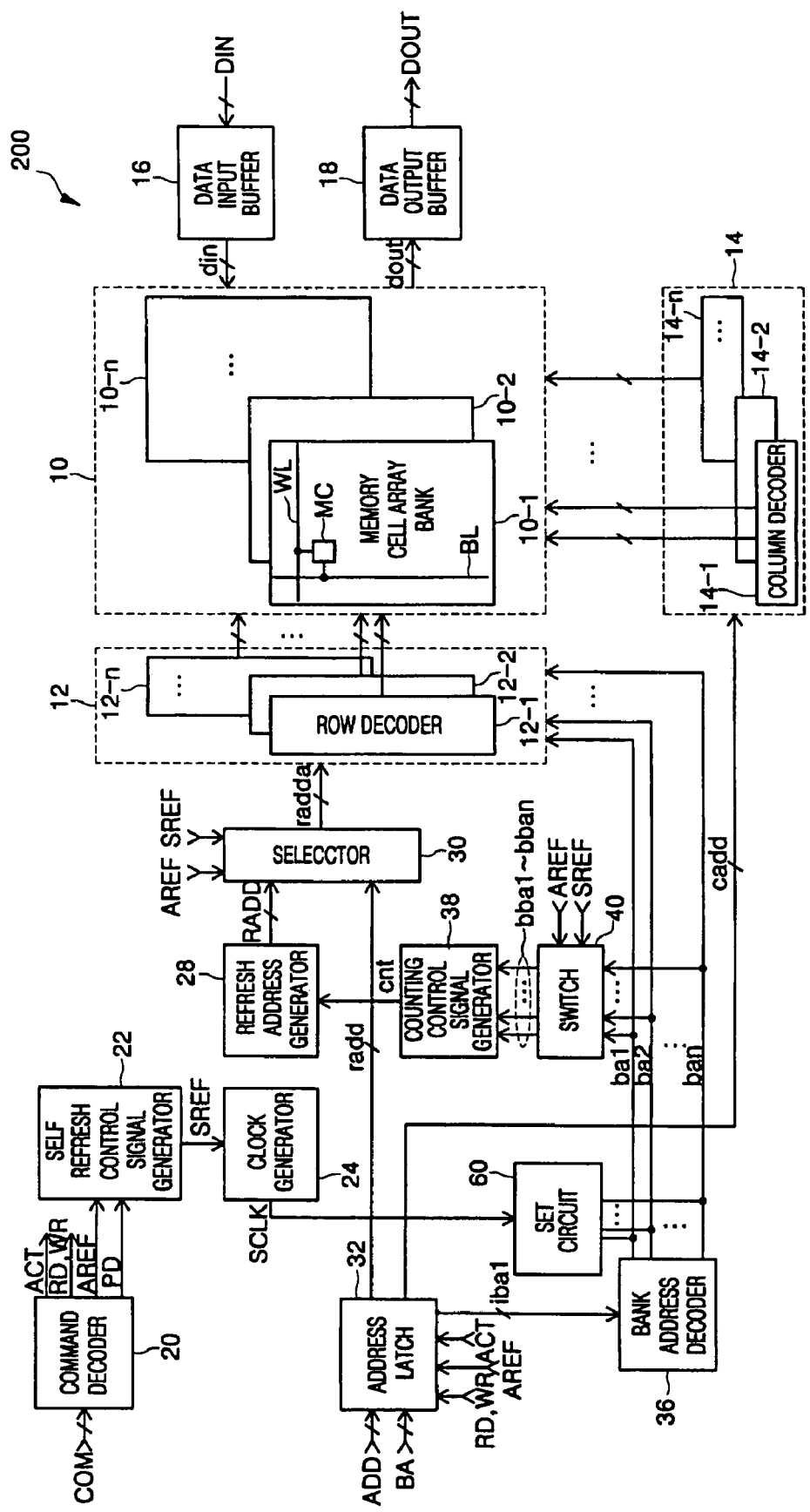
FIGS. 6A and 6B illustrate in block diagram form, respectively, decoded auto-refresh and external auto-refresh signal versions of a synchronous dynamic random access memory (SDRAM) device according to a second embodiment.
Figure 6B:
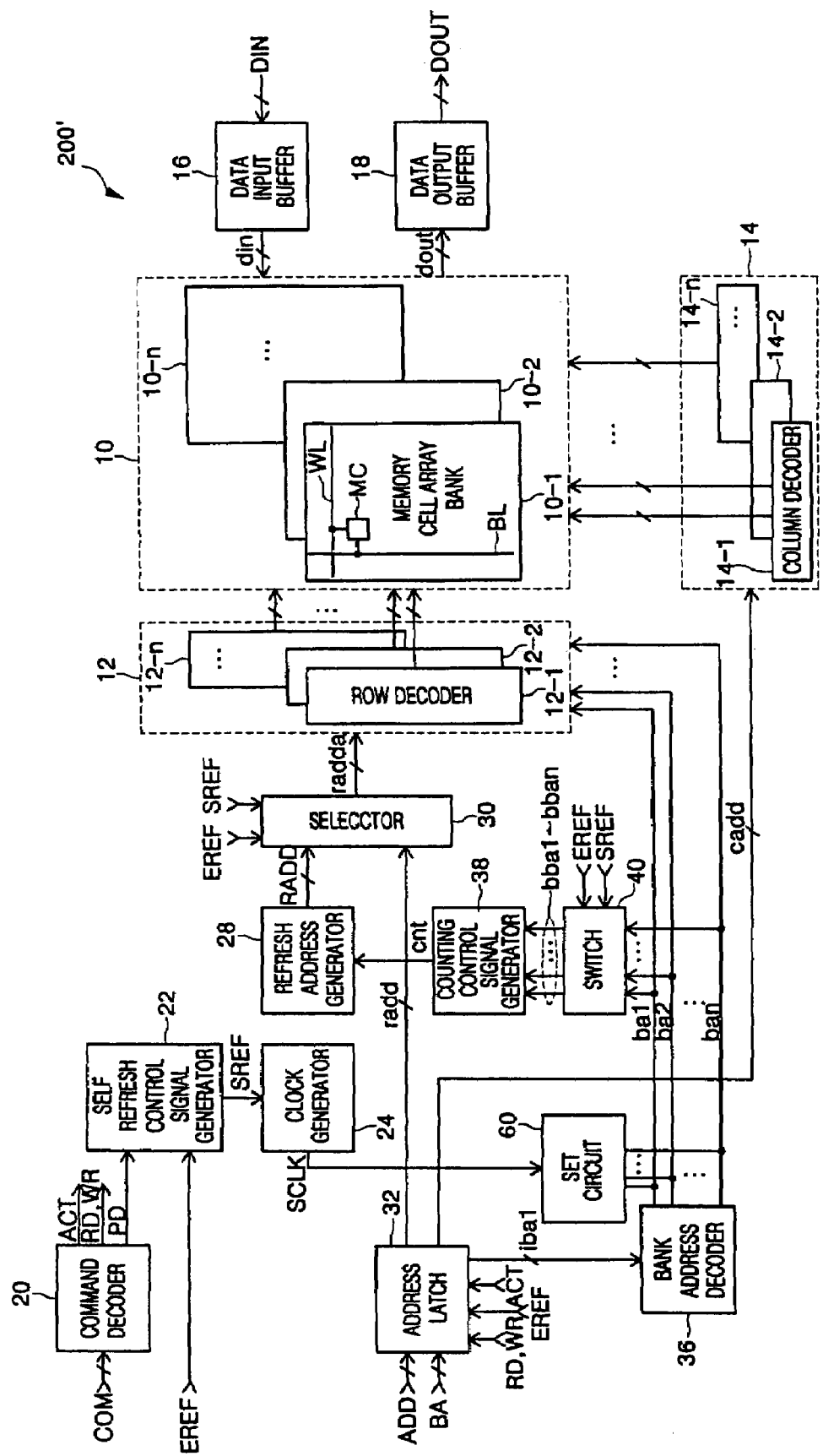

FIGS. 6A and 6B illustrate, respectively, SDRAM devices 200 and 200' according to a second embodiment, in block diagram form. In many respects, SDRAM devices 200 and 200' are similar to SDRAM devices 100 and 100'. Those aspects of SDRAM devices 200 and 200' that are unchanged from SDRAM devices 100 and 100' will not be re-described.

Several elements of FIG. 1A—bank address generator 26 and first switch 34—are not included in FIGS. 6A and 6B. Accordingly, internal bank address iba1 is the solitary input to bank address decoder 36.

Instead of a bank address generator, FIG. 6A includes a set circuit 60 that is driven by self-refresh clocking signal SCLK. Set circuit 60 has one output connected to each bank select signal ba1 to ban. When SCLK is pulsed, set circuit 60 asserts each bank select signal, thus causing all banks to be refreshed for the current refresh row at once.

Switch 40 passes all bank select signals to counting control signal generator 38, causing cnt to be asserted at each self-refresh cycle.

Figure 7:
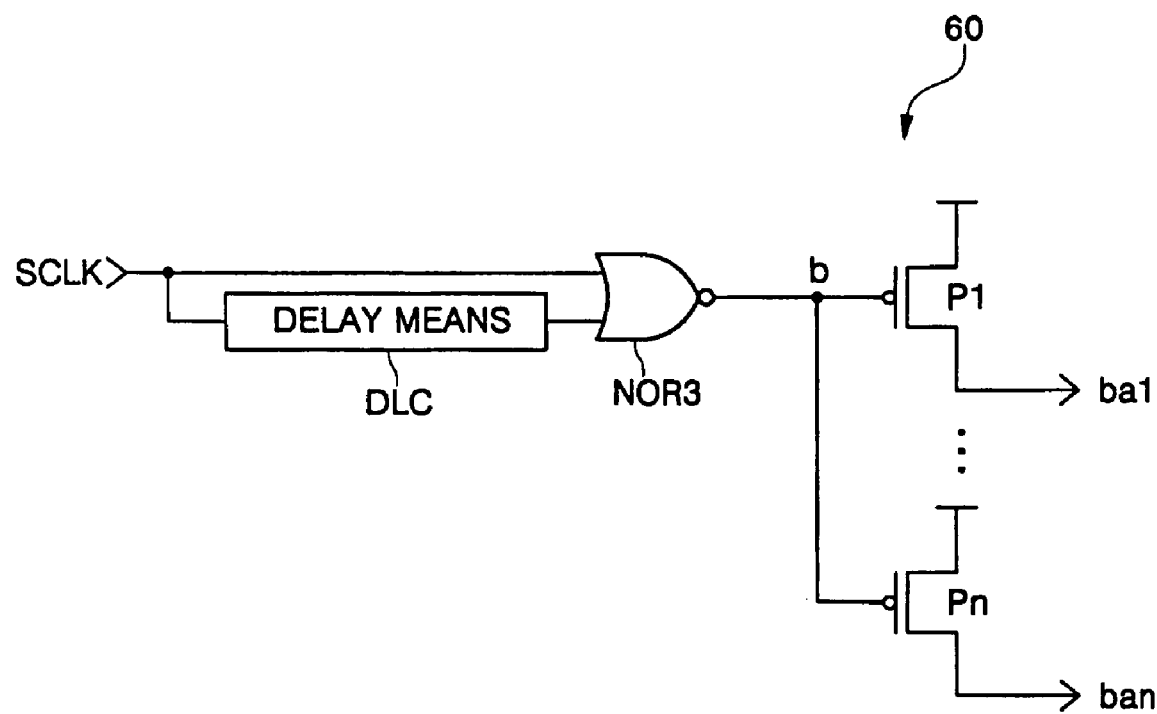
FIG. 7 illustrates a set circuit useful, e.g., in the SDRAM device of FIGS. 6A and 6B.

FIG. 7 shows one possible configuration for set circuit 60, comprising a delay means DLC, a NOR gate NOR3, and n p-channel transistors P1–Pn. SCLK is received at one input of NOR3 and at the input of delay means DLC. The output of delay means DLC—a delayed version of SCLK—is supplied to the other input of NOR3. The delay time of delay means DLC is designed to be less than the positive pulse time of SCLK. This allows a positive SCLK pulse to appear at the output of DLC while the original pulse is still active. The result is an extended negative pulse at a node b at the output of NOR3.

Node b connects to the gates of each p-channel transistor P1 to Pn. Each p-channel transistor is coupled between a positive power supply voltage and a respective one of the bank select signal lines ba1 to ban. Thus when NOR3 drives node b low, each p-channel transistor is activated, connecting each bank select signal line to the positive power supply voltage.

Figure 8:
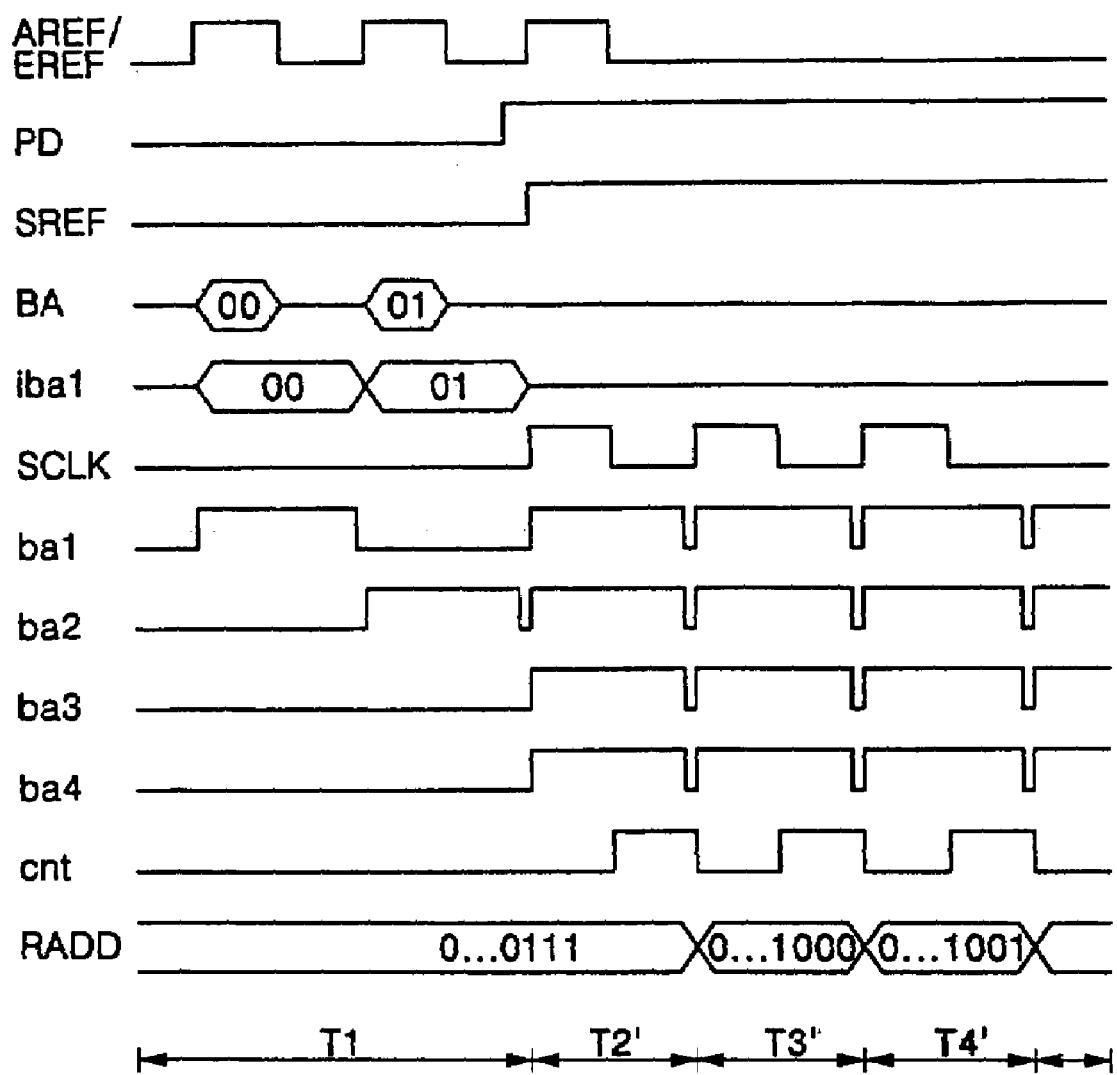
FIG. 8 contains a timing diagram showing an auto-refresh-to-self-refresh transition for the SDRAM device of FIGS. 6A and 6B.

FIG. 8 contains an exemplary timing diagram for SDRAM devices 200 and 200'. Like in the previous timing examples, auto-refresh operations are complete for banks 10-1 and 10-2, on the row with row address 0 . . . 0111, at the time that a power-down command (PD) is issued. When self-refresh control signal generator 22 activates SREF, clock generator 24 pulses SCLK. Set circuit 60 responds by asserting bank select signals ba1, ba2, ba3, and ba4 at the same time. This causes all four banks 10-1, 10-2, 10-3, and 10-4 to be refreshed simultaneously for row address 0 . . . 0111, which was selected during the auto refresh operation. Switch 40 passes all four bank select signals as buffered bank select signals bba1–bba4 to counting control signal generator 38. Counting control signal generator 38 generates a positive pulse on cnt, resetting itself and advancing refresh address generator 28 to a new row address RADD with a value 0 . . . 1000. Each self-refresh cycle T2', T3', T4', etc. refreshes all four banks at once, with T2' refreshing simultaneously all banks for the row that was being auto-refreshed at the time of entry to self-refresh mode.

Figure 9A:
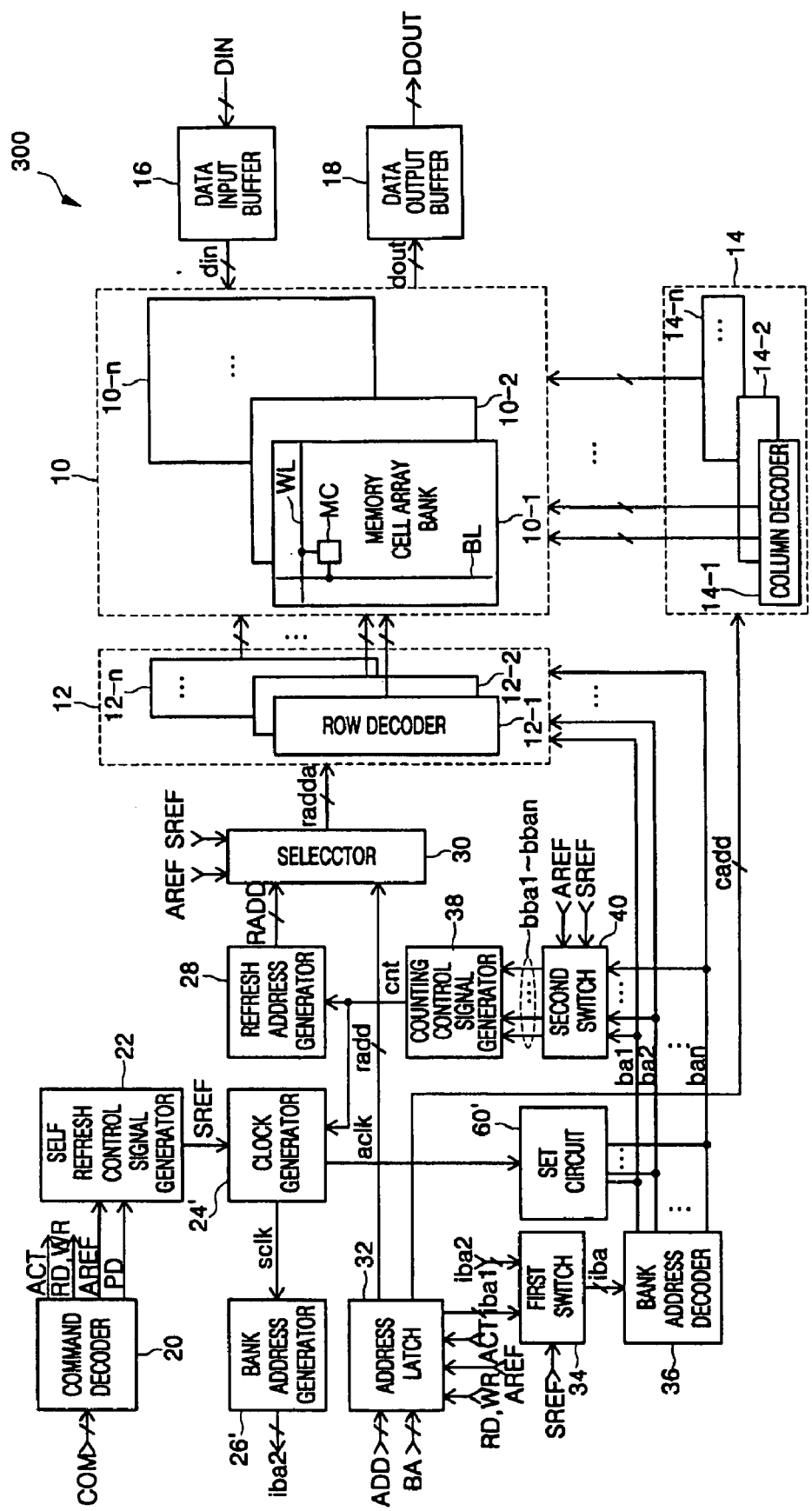
FIGS. 9A and 9B illustrate in block diagram form, respectively, decoded auto-refresh and external auto-refresh signal versions of a synchronous dynamic random access memory (SDRAM) device according to a third embodiment.
Figure 9B:
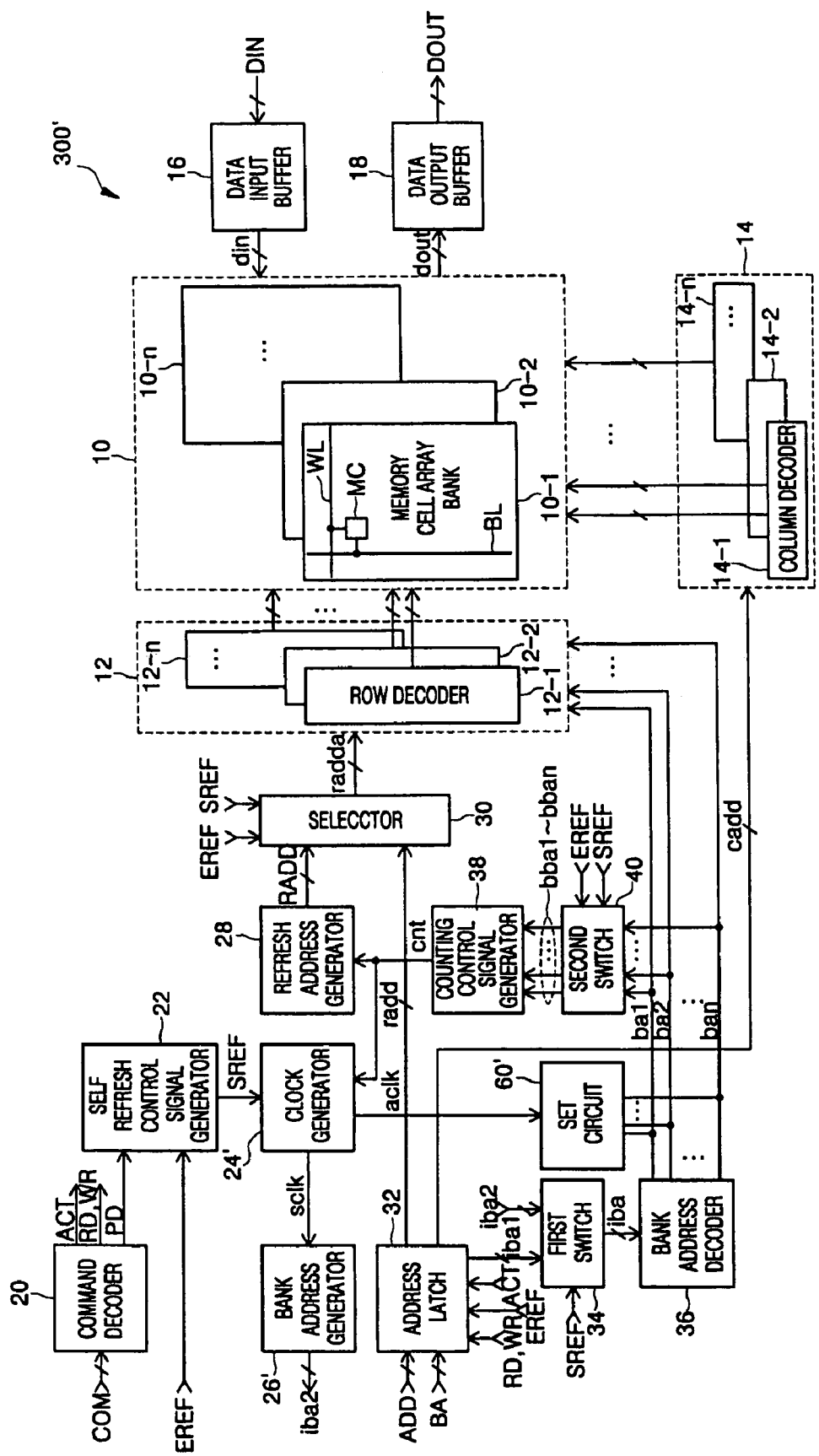

FIGS. 9A and 9B present a third embodiment, respectively, for a decoded-refresh command SDRAM 300 and an external-refresh signal SDRAM 300'. Taking FIG. 9A as an example, the SDRAM of FIG. 1A is enhanced with a set circuit 60' like set circuit 60 of FIG. 7. A self-refresh clock generator 24', as shown in FIG. 4, is used, with the clock signals aclk and sclk supplied as outputs. Clock signal aclk supplies set circuit 60', and clock signal sclk supplies bank address generator 26.

Figure 10:
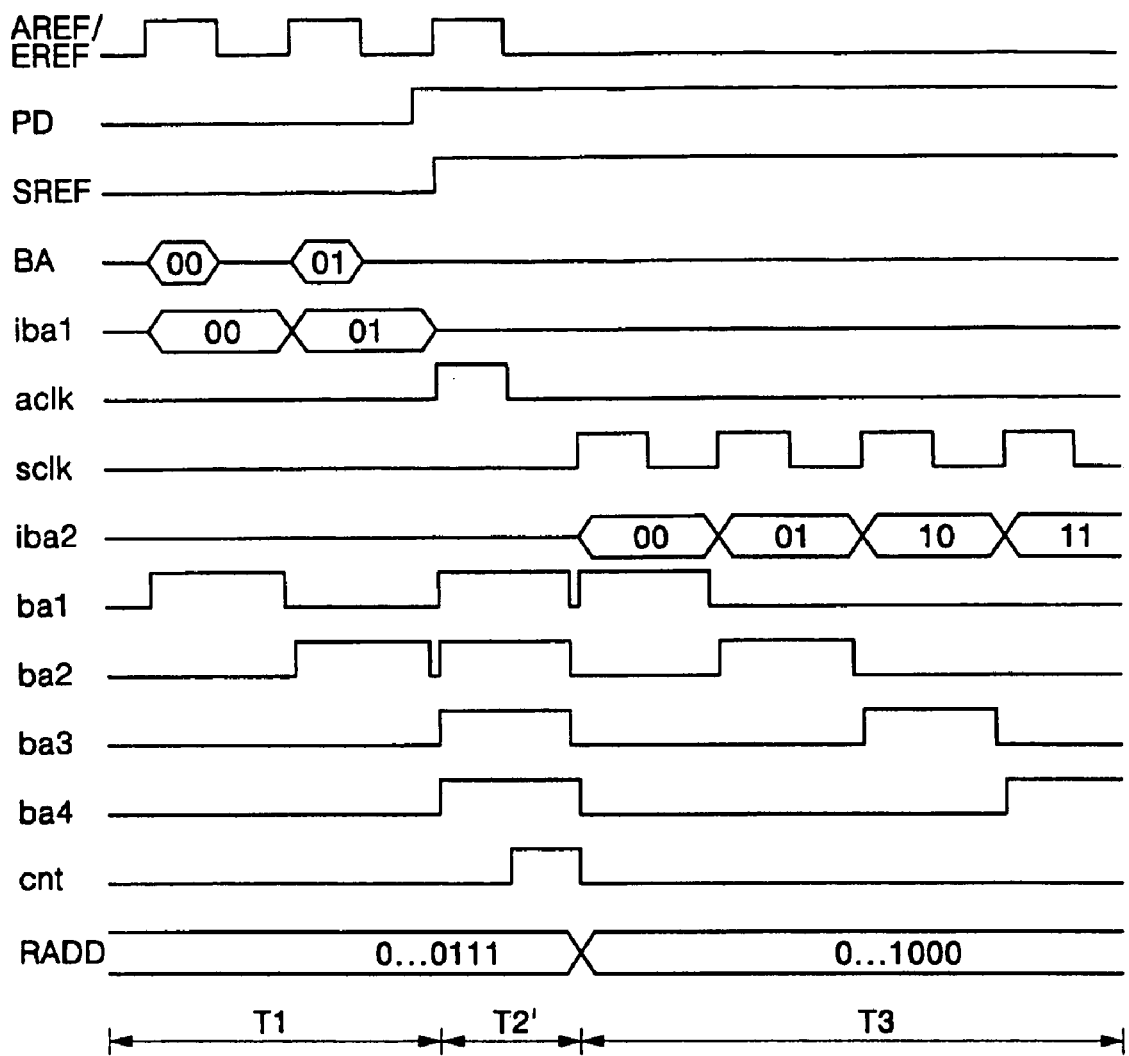
FIG. 10 contains a timing diagram showing an auto-refresh-to-self-refresh transition for the SDRAM device of FIGS. 9A and 9B.

FIG. 10 contains a timing diagram illustrating the operation of SDRAM devices 300 and 300'. Like in the previous timing examples, auto-refresh operations are complete for banks 10-1 and 10-2, on the row with row address 0 . . . 0111, at the time that a power-down command is issued. When self-refresh control signal generator 22 activates SREF, clock generator 24' generates a positive pulse on aclk. Like in FIG. 8, this positive pulse causes set circuit 60' to assert all bank select signals. This causes all four banks 10-1, 10-2, 10-3, and 10-4 to be refreshed simultaneously for row address 0 . . . 0111 during time period T2'. Switch 40 passes all four bank select signals as buffered bank select signals bba1–bba4 to counting control signal generator 38. Counting control signal generator 38 generates a positive pulse for counting signal cnt, resetting itself and advancing refresh address generator 28 to a new row address RADD with a value 0 . . . 1000 during time period T3.

The positive pulse on cnt also causes clock generator 24' to disable aclk generation and begin sclk generation. Over four following sclk pulses, bank address generator 26 steps through all bank addresses 00, 01, 10, and 11, causing bank address decoder 36 to successively assert bank select signals ba1, ba2, ba3, and ba4. Thus over four sclk pulses during time period T3, the four memory banks 10-1, 10-2, 10-3, and 10-4 are successively refreshed for row address RADD with a value 0 . . . 1000 to be refreshed. Counting control signal generator 38 registers that each bank has been refreshed, and asserts cnt at the end of time period T3 to advance the row address and start the bank address generator cycle over for a new refresh row.

Figure 11:
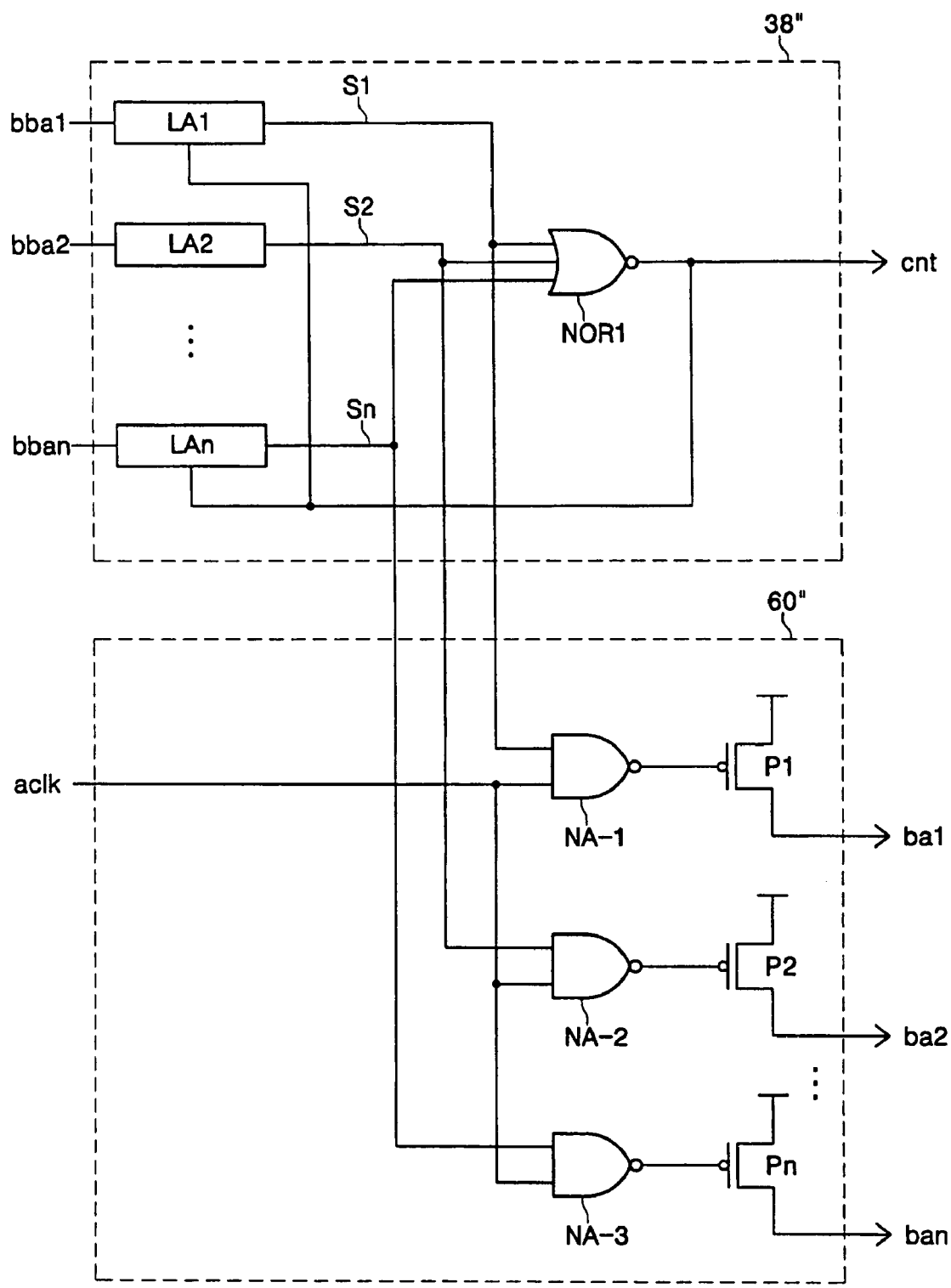
FIG. 11 illustrates an alternate arrangement for a counting control signal generator and a set circuit useful, e.g., in the FIGS. 9A/9B circuit to form a synchronous dynamic random access memory (SDRAM) device according to a permutation of the third embodiment.

FIG. 11 shows a permutation on the set circuit and counting control signal generator of FIGS. 9A and 9B. A counting control signal generator 38" is arranged similar to counting control signal generator 38 of FIG. 2. The outputs of latches LA1–LAn, labeled S1–Sn, are routed to NOR1 and are also routed to set circuit 60".

Set circuit 60" receives the signal aclk, which drives one input, respectively, of n NAND gates NA-1 to NA-n. The other inputs of NAND gates NA-1 to NA-n are driven, respectively, by signals S1 to Sn from counting control signal generator 38". The outputs of NAND gates NA-1 to NA-n respectively drive the gates of p-channel transistors P1 to Pn. P-channel transistors P1 to Pn are connected, like in FIG. 7, to bank select signal lines ba1 to ban.

Figure 12:
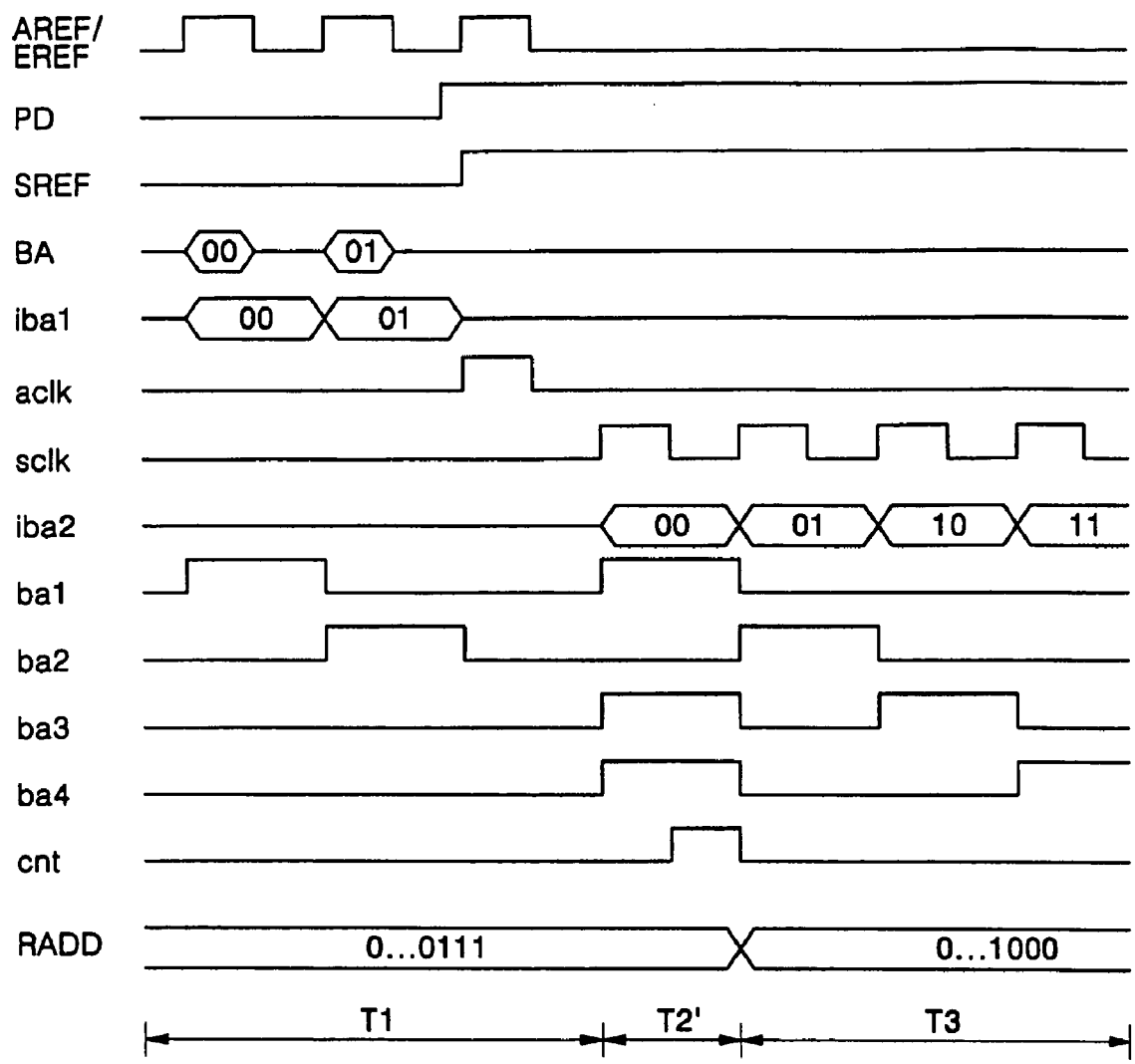
FIG. 12 contains a timing diagram showing an auto-refresh-to-self-refresh transition for an SDRAM device using the counting control signal generator and set circuit of FIG. 11.

FIG. 12 contains a timing diagram showing the operation of the SDRAM devices 300 and 300' when counting control signal generator 38" and set circuit 60" are used. When the power-down command is issued, latches LA1 and LA2 are set (with low outputs) because two prior auto-refresh commands during time period T1 were directed to bank addresses 00 and 01. Latches L3 (not shown) and L4 (e.g., Ln in FIG. 11) are not set, and thus have high outputs. As a result, when aclk is asserted, NA-3 (not shown) and NA-4 (e.g., NA-n in FIG. 11) are driven low, activating transistors P3 (not shown) and P4 (e.g., Pn in FIG. 11). Thus as shown in FIG. 12, bank select signals ba3 and ba4 are pulsed and a refresh operation is carried out during time period T2' on memory banks 10-3 and 10-4, but not memory banks 10-1 and 10-2. This completes refresh operations for RADD 0 . . . 0111, causing counting control signal generator 38" to assert cnt. The assertion of cnt transfers operation to the bank address generator for normal self-refresh operation, as previously described.

Figure 13A:
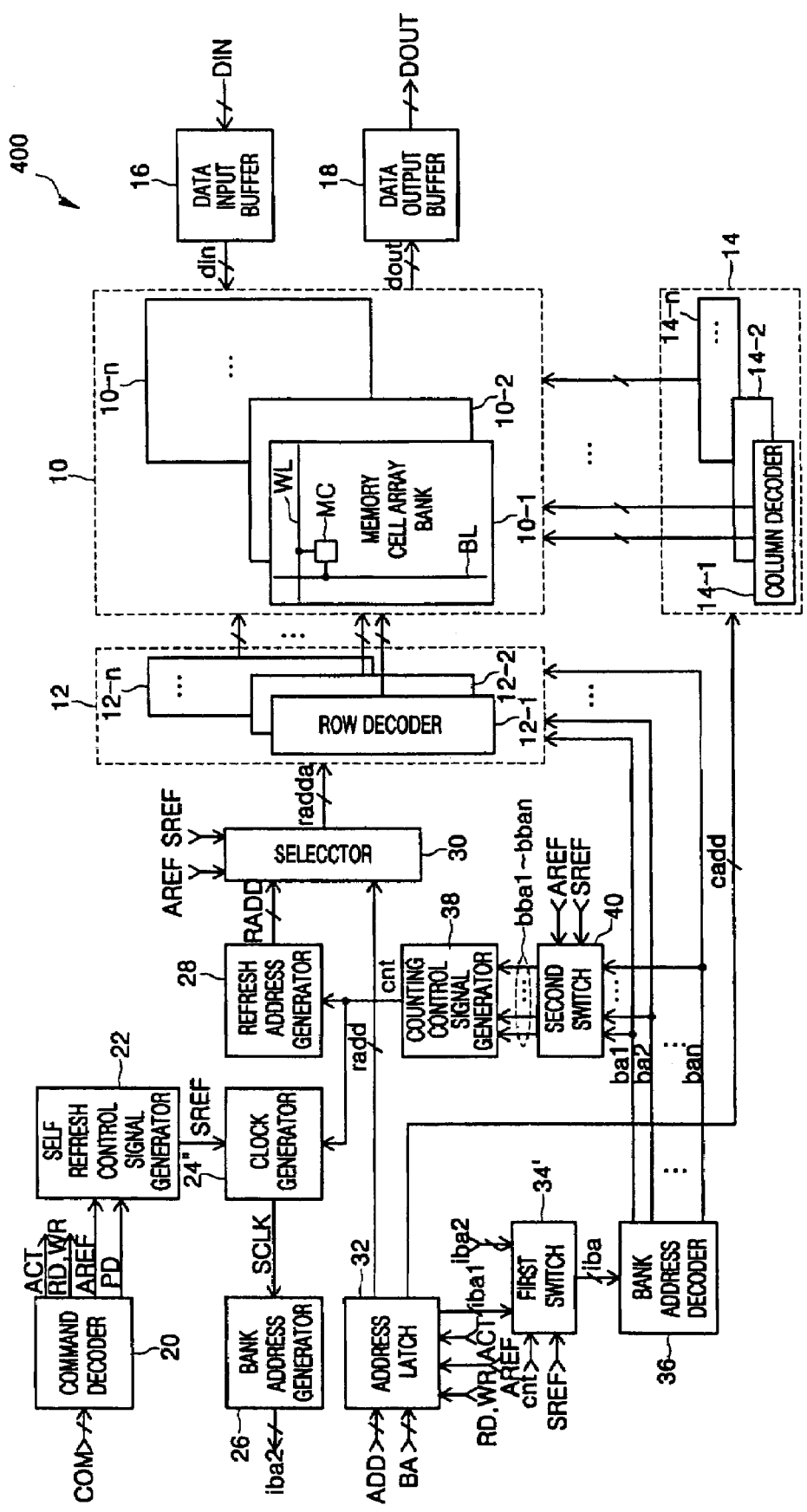
FIGS. 13A and 13B illustrate in block diagram form, respectively, decoded auto-refresh and external auto-refresh signal versions of a synchronous dynamic random access memory (SDRAM) device according to a fourth embodiment.
Figure 13B:
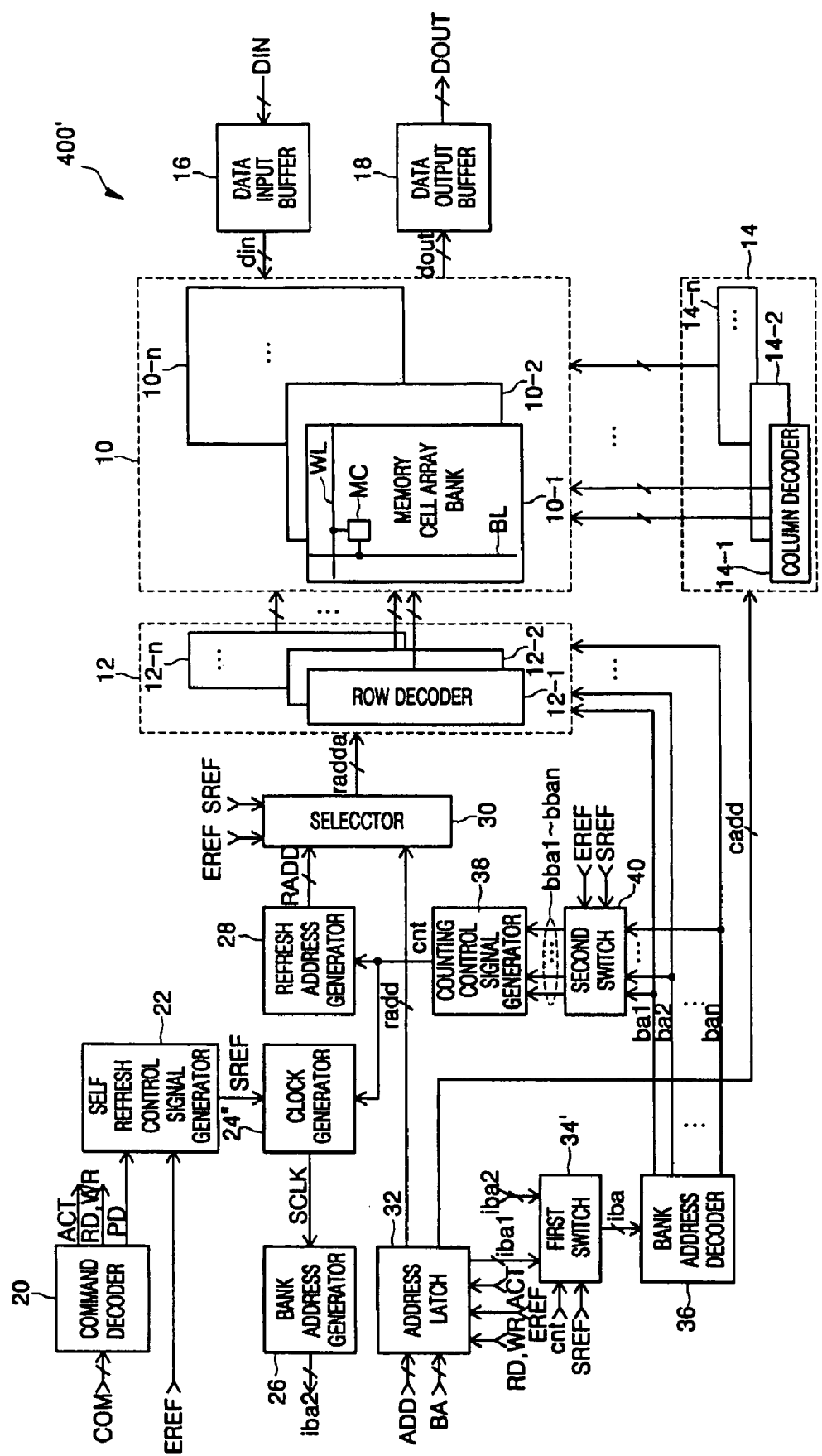
Figure 14:
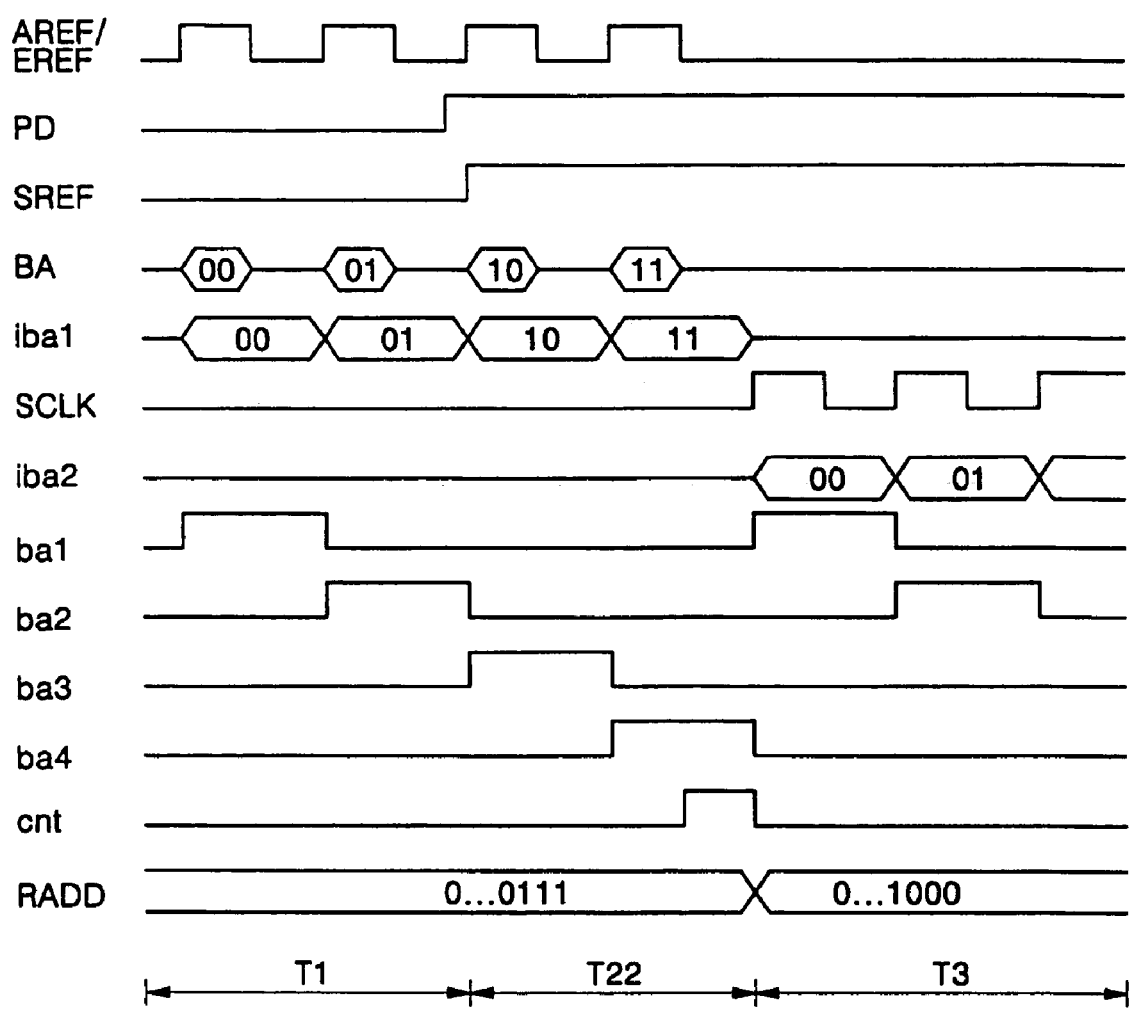
FIG. 14 contains a timing diagram showing an auto-refresh-to-self-refresh transition for the SDRAM device of FIGS. 13A and 13B.

FIGS. 13A and 13B illustrate a fourth embodiment, respectively, for a decoded-refresh command SDRAM 400 and an external-refresh signal SDRAM 400'. The primary difference between SDRAM 400, for example, and SDRAM 100, lies in the operation of first switch 34' and clock generator 24". These differences are best explained with reference to the timing diagram of FIG. 14.

Like in the previous timing diagrams, an example is presented where a power-down command is issued when auto-refresh commands have been issued for bank addresses 00 and 01 and a current refresh row. Unlike in FIG. 3, however, the assertion of SREF by self-refresh control signal generator does not cause first switch 34' to select internal bank address iba2. Instead, first switch 34' continues to select internal bank address iba1 from address latch 32. Also, clock generator 24" does not begin issuing SCLK pulses at the beginning of self-refresh mode.

In the FIG. 13A/13B embodiment, the memory controller is expected to complete refresh operations for the current row, even though self-refresh mode has been entered. SDRAM device 400 continues to respond to AREF commands during a time period T22 at the start of self-refresh mode. Thus a memory controller supplies the remaining bank addresses (10 and 11) for the current row while issuing new auto-refresh commands in self-refresh mode, causing banks 10-3 and 10-4 to be refreshed for row address RADD with a value 0 . . . 0111.

At the end of time period T22, counting control signal generator 38 detects that all banks have been addressed for the current refresh row, and pulses count signal cnt. This count signal (cnt) increases refresh address RADD through the refresh address generator 28, activates (in combination with SREF) clock generator 24", and switches (in combination with SREF) first switch 34' from selecting internal bank address iba1 to selecting internal bank address iba2. This transition causes the memory device to enter normal self-refresh mode.

Figure 15:
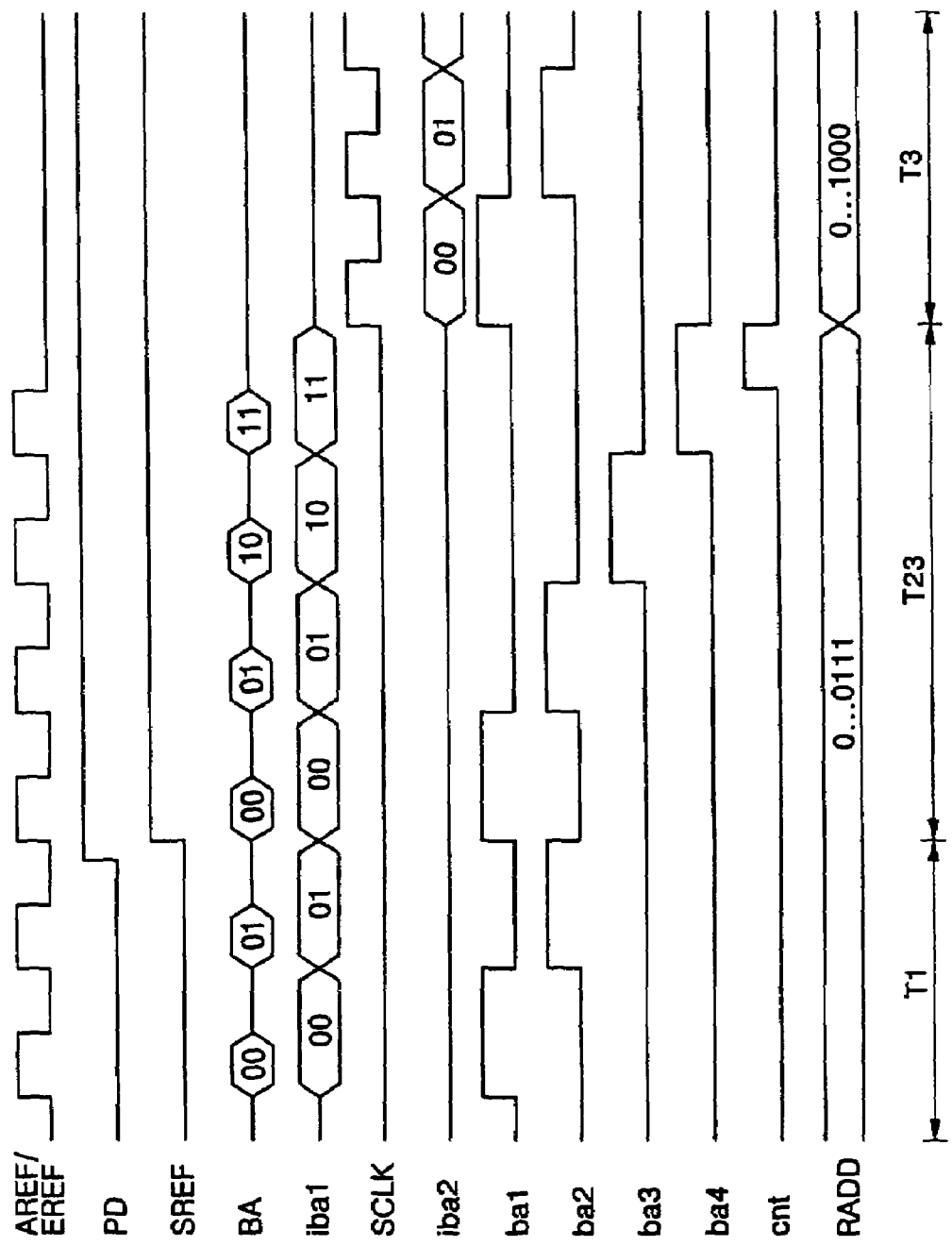
FIG. 15 contains an alternate timing diagram showing an auto-refresh-to-self-refresh transition for the SDRAM device of FIGS. 13A and 13B.

FIG. 15 shows an alternate legal timing diagram for SDRAM devices 400 and 400'. This timing diagram illustrates that the memory controller need not track the number or identity of memory banks that have not yet been refreshed for the current row when self-refresh mode is entered. Instead, the memory controller issues one auto-refresh command for each bank after entering self-refresh mode. If it so happens that the current row advances before the end of this cycle because all banks have been addressed for the current row, any remaining auto-refresh cycles are ignored.

The memory devices described in the preceding embodiments are intended for use with a memory controller in a memory system. The memory controller can be integrated in a processor, or can be a separate integrated circuit that interfaces between memory and a processor. Several representative memory systems are illustrated in FIGS. 16–19.

Figure 16:
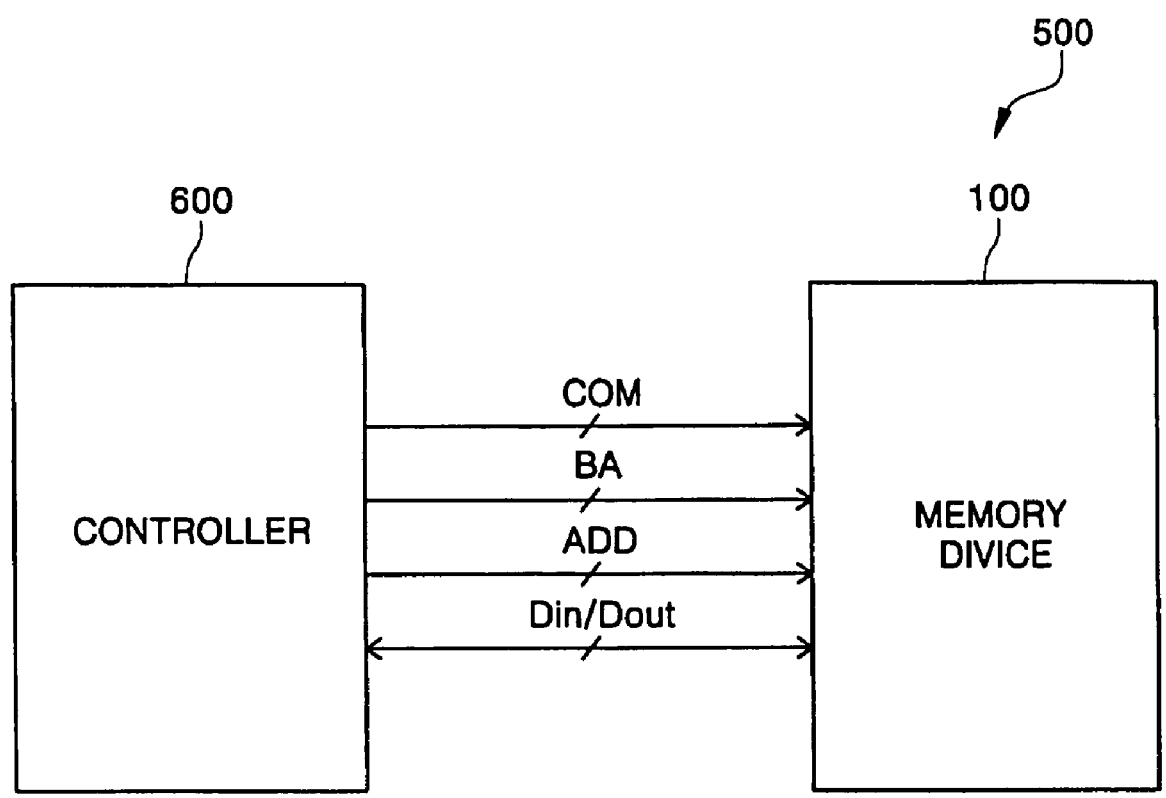
FIG. 16 depicts a memory system according to an embodiment using decoded auto-refresh commands.

FIG. 16 shows a memory system 500 comprising a memory controller 600 and a memory device 100. Memory controller 600 supplies commands COM, bank addresses BA, and row/column addresses ADD to memory device 100 over buses as illustrated. For write commands, memory controller 600 supplies write data Din to memory device 100 over a data bus. For read commands, memory controller 600 receives read data Dout from memory device 100 over the data bus. The memory controller is expected to provide Per-Bank Refresh (PBR) auto-refresh commands to memory device 100 when the device is in normal mode. Controller 600 is allowed, however, to place memory device 100 in a power-down state without regard to the state of the PBR cycle, as explained above. Of course, memory device 100 could be replaced, e.g., with memory device 200 or 300 described above as well. Memory device 100 could also be replaced with memory device 400, with a controller 600 that provides the additional auto-refresh commands, after entry to a power-down state, necessary to complete the PBR cycle for the current refresh row.

Figure 17:
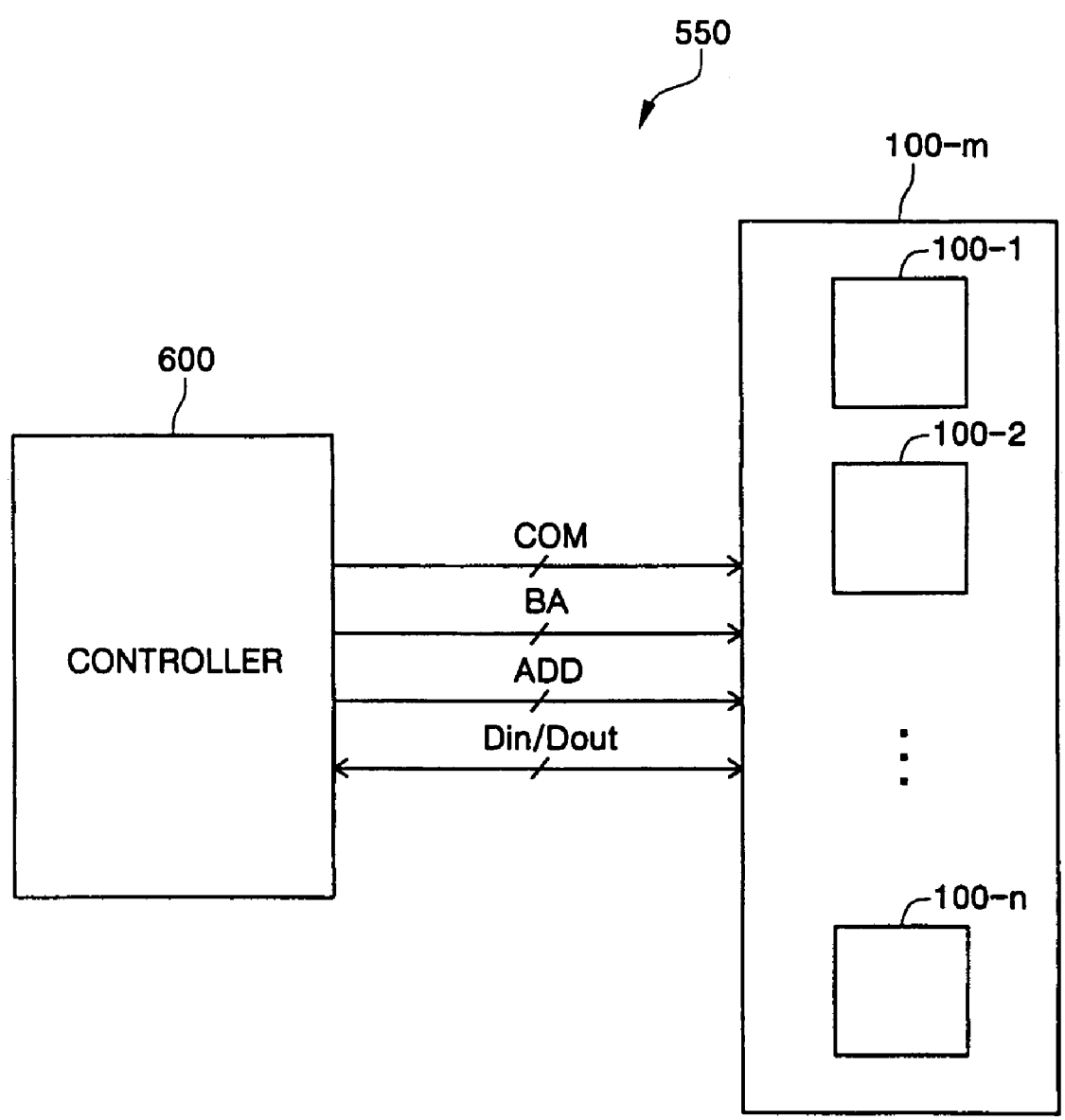
FIG. 17 depicts a memory system according to an embodiment using decoded auto-refresh commands and a memory module comprising multiple memory devices.

Although a single memory device is shown in FIG. 16, many memory systems incorporate one or more memory modules. FIG. 17 illustrates a memory system 550 using controller 600 and a memory module 100-m incorporating multiple memory devices 100-1 to 100-n of the same type as memory device 100 (or, e.g., 200, 300, or 400 as discussed above). Function is similar to FIG. 16, with buffers and/or traces (not shown) on module 100-m distributing the COM, BA, and ADD signals to each memory device 100-1 to 100-n.

Figure 18:
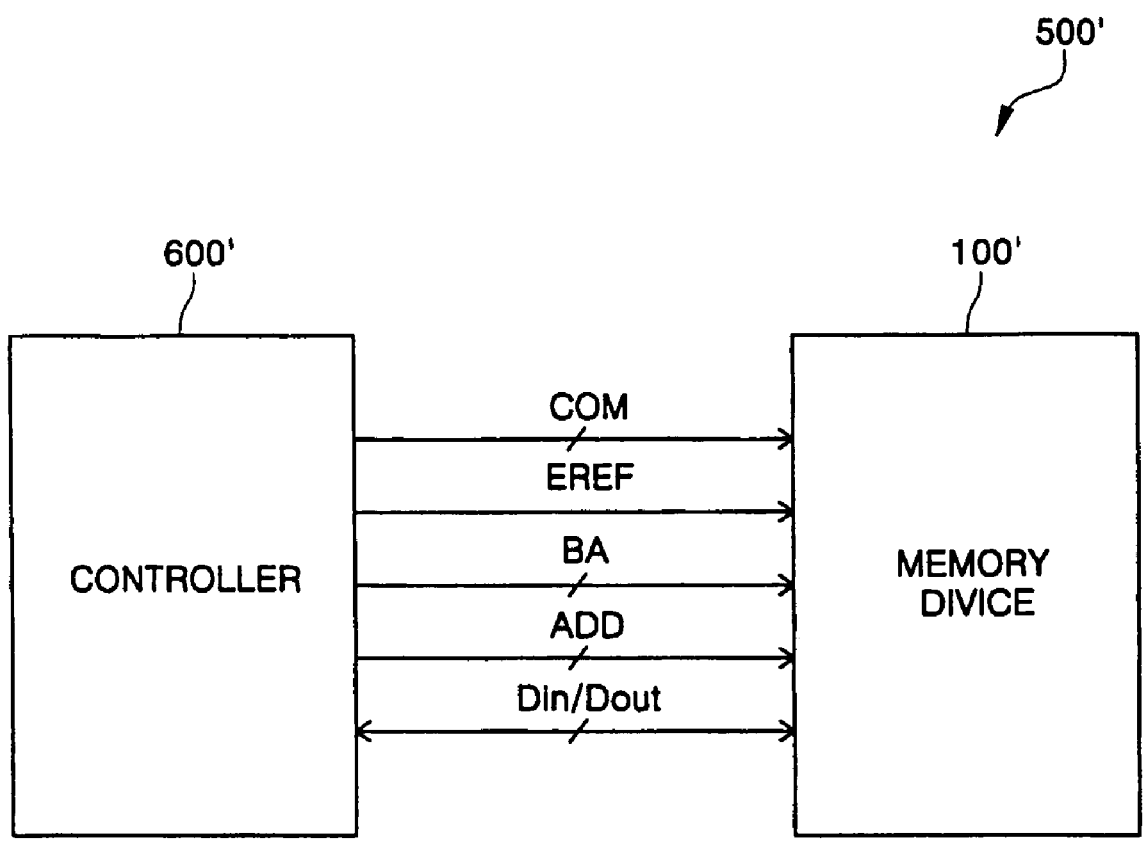
FIG. 18 depicts a memory system according to an embodiment using external auto-refresh signals.
Figure 19:
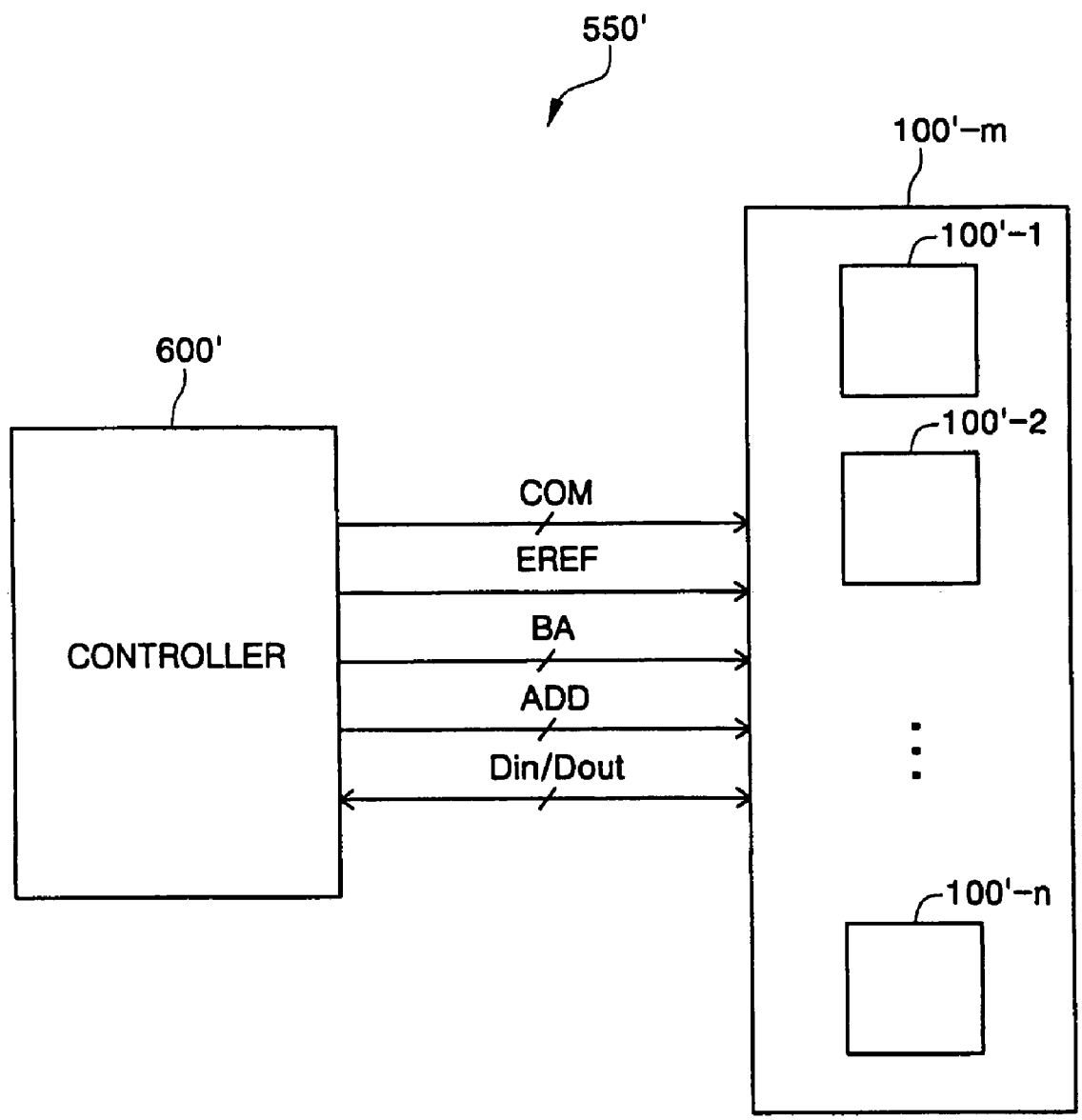
FIG. 19 depicts a memory system according to an embodiment using external auto-refresh signals and a memory module.

FIGS. 16 and 17 illustrate memory systems that use decoded auto-refresh commands. FIGS. 18 and 19 illustrate analogous memory systems 500' and 550' that use an external auto-refresh signal EREF, supplied by a memory controller 600', to initiate auto-refresh operations. Memory systems 500' and 550' use the external auto-refresh versions of the memory devices described above, e.g., memory devices 100', 200', 300', and 400'.

Those skilled in the art will recognize that many other device configuration permutations can be envisioned and many design parameters have not been discussed. For instance, various features of the described embodiments can be combined with other embodiments in other permutations. The specific circuits described and shown in the drawings are merely exemplary—in most cases, other circuits can accomplish the same or similar functions. Such minor modifications and implementation details are encompassed within the embodiments of the invention, and are intended to fall within the scope of the claims.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

What is claimed is:

1. A method of operating a synchronous memory device having a plurality of memory cell array banks, the method comprising:
   receiving an external refresh bank address;
   performing an auto-refresh operation on a current row of a memory cell array bank corresponding to the external refresh bank address;
   responding to a power-down command by entering a self-refresh mode; and
   completing auto-refresh operation for the current row for all memory cell array banks prior to updating the current row to a new row for the first time in the self-refresh mode.

2. The method of claim 1, wherein completing an auto-refresh operation for the current row for all memory cell array banks comprises sequencing through all memory cell array banks and performing a refresh operation for the current row in each bank.

3. The method of claim 2, further comprising, during sequencing through all memory cell array banks prior to updating the current row to a new row for the first time in self-refresh mode, clocking refresh operations at a faster rate than the refresh rate used after updating the current row to a new row for the first time in self-refresh mode.

4. The method of claim 1, wherein completing an auto-refresh operation for the current row for all memory cell array banks comprises initiating a simultaneous refresh operation to the current row in all memory cell array banks.

5. The method of claim 4, further comprising after updating the current row to a new row for the first time in self-refresh mode, performing a simultaneous self-refresh operation to the new current row in all memory cell array banks for each subsequent row.

6. The method of claim 5, wherein performing a simultaneous self-refresh operation comprises enabling a bank address signal for each bank during each self-refresh operation.

7. The method of claim 4, wherein performing a simultaneous self-refresh operation comprises enabling a bank address signal for each bank during each self-refresh operation.

8. The method of claim 4, further comprising after updating the current row to a new row for the first time in self-refresh mode, performing sequential self-refresh operations to the memory cell array banks for each subsequent row.

9. The method of claim 1, wherein completing an auto-refresh operation for the current row and all memory cell array banks comprises:
   accepting additional external refresh bank addresses after entering self-refresh mode without leaving self-refresh mode, until a refresh operation has been performed for the current row in each memory cell array bank; and
   performing self-refresh operations after the current row is updated to a new row for the first time in the self-refresh mode.

10. The method of claim 9, wherein the number of additional external refresh bank addresses accepted after entering self-refresh mode is equal to the number of memory cell array banks.

11. The method of claim 9, wherein the number of additional external refresh bank addresses accepted after entering self-refresh mode is equal to the number of memory cell array banks that have not yet had a refresh operation performed for the current row.

12. The method of claim 1, wherein completing an auto-refresh operation for the current row and all memory cell array banks prior to updating the current row to a new row for the first time in the self-refresh mode comprises initiating a simultaneous refresh operation to the current row in all memory cell array banks that have not yet had a refresh operation performed for the current row.

13. A method of operating a synchronous memory device having a plurality of memory cell array banks, the method comprising:
   receiving an external refresh bank address;
   performing an auto-refresh operation on a current row of a memory cell array bank corresponding to the external refresh bank address;
   responding to a power-down command by entering a self-refresh mode;
   in self-refresh mode, sequencing through all memory cell array banks and performing a refresh operation for the current row in each bank; and
   subsequently updating the current row to a new row for the first time in the self-refresh mode.

14. A method of operating a synchronous memory device having a plurality of memory cell array banks, the method comprising:
   receiving an external refresh bank address;
   performing an auto-refresh operation on a current row of a memory cell array bank corresponding to the external refresh bank address;
   responding to a power-down command by entering a self-refresh mode;
   in self-refresh mode, initiating a simultaneous refresh operation to the current row in all memory cell array banks; and
   subsequently updating the current row to a new row for the first time in the self-refresh mode.

15. A method of operating a synchronous memory device having a plurality of memory cell array banks, the method comprising:
   receiving an external refresh bank address;
   performing an auto-refresh operation on a current row of a memory cell array bank corresponding to the external refresh bank address;
   responding to a power-down command by entering a self-refresh mode;
   in self-refresh mode, initiating a simultaneous refresh operation to the current row in all memory cell array banks;
   subsequently updating the current row to a new row for the first time in the self-refresh mode; and
   performing sequential self-refresh operations to the memory cell array banks for each subsequent row.

16. A method of operating a synchronous memory device having a plurality of memory cell array banks, the method comprising:
   receiving an external refresh bank address;
   performing an auto-refresh operation on a current row of a memory cell array bank corresponding to the external refresh bank address;
   responding to a power-down command by entering a self-refresh mode;
   in self-refresh mode, accepting additional external refresh bank addresses without leaving self-refresh mode, until a refresh operation has been performed for the current row in each memory cell array bank;
   subsequently updating the current row to a new row for the first time in the self-refresh mode; and performing self-refresh operations after the current row is updated to a new row.

17. A method of operating a synchronous memory device having a plurality of memory cell array banks, the method comprising:
receiving an external refresh bank address;
performing an auto-refresh operation on a current row of a memory cell array bank corresponding to the external refresh bank address;
responding to a power-down command by entering a self-refresh mode;
in self-refresh mode, initiating a simultaneous refresh operation to the current row in all memory cell array banks that have not yet had a refresh operation performed for the current row;
subsequently updating the current row to a new row for the first time in the self-refresh mode; and
performing self-refresh operations after the current row is updated to a new row.

18. A method of operating a synchronous memory device having a plurality of memory cell array banks, the method comprising:
receiving an external refresh request;
performing an auto-refresh operation on a current row of a memory cell array bank in response to the external refresh request;
responding to a power-down command by entering a self-refresh mode;
in self-refresh mode, accepting additional external refresh requests without leaving self-refresh mode, and performing corresponding auto-refresh operations until a refresh operation has been performed for the current row in each memory cell array bank;
subsequently updating the current row to a new row for the first time in the self-refresh mode; and
performing self-refresh operations after the current row is updated to a new row.

19. A method of operating a memory controller, the method comprising:
issuing auto-refresh bank addresses, to a memory unit having n memory cell array banks, in a sequence that addresses all n banks, and then addresses all n banks again, such that the memory unit can sequentially refresh a current row in all n banks according to the auto-refresh bank address sequence before refreshing another row in one of the banks;
issuing a power-down command to the memory unit; and
without waking the memory unit, issuing additional auto-refresh bank addresses to the memory unit to allow the memory unit to complete refresh operations for the current row before beginning self-refresh operations.

20. The method of claim 19, wherein the number of additional auto-refresh bank addresses issued after the power-down command is equal to n.

21. The method of claim 19, wherein the number of additional auto-refresh bank addresses issued after the power-down command is equal to the number of memory cell array banks that have not yet had a refresh operation performed for the current row.

22. A memory system comprising:
at least one memory unit having n memory banks and a bank-addressable auto-refresh operation, the memory unit comprising auto-refresh circuitry that addresses auto-refresh operations to a refresh row in each addressed bank until each of the n banks have been addressed in at least one auto-refresh operation, the memory unit having circuitry for completing refresh operations for the refresh row in each not-yet-addressed bank upon entering a self-refresh mode; and
a controller to assert active commands and supply external refresh bank address signals to the memory unit, the controller having a normal auto-refresh mode that supplies all n bank address signals in n successive auto-refresh operations for a refresh row, and supplies all n bank address signals in the following n successive auto-refresh operations for a next refresh row, wherein the controller can signal the memory unit to enter self-refresh mode without completing n successive auto-refresh operations for a current refresh row.

23. The memory system of claim 22, further comprising an external refresh signal line connected between the memory unit and the controller to allow the controller to initiate auto-refresh operations on the memory unit.

24. The memory system of claim 23, wherein the memory unit responds to auto-refresh operations signaled on the external refresh signal line after entering self-refresh mode, until each bank has been addressed in at least one auto-refresh operation for the refresh row.

25. The memory system of claim 22, further comprising command signal lines connected between the memory unit and the controller, the controller requesting that the memory unit perform active commands, auto-refresh commands, and self-refresh commands by placing appropriate signaling on the command signal lines.

26. A synchronous memory device comprising:
a plurality n of independently addressable memory cell array banks;
a refresh address generator to specify a current refresh row to all memory cell array banks;
bank address circuitry to receive an externally supplied bank address for a refresh operation and apply the refresh operation to the memory cell array bank corresponding to the bank address;
a refresh bank address counter to signal the refresh address generator to generate a new refresh row when refresh operations have been addressed to the current refresh row in each of the plurality of memory cell array banks; and
self-refresh circuitry to apply refresh operations to the memory cell array banks in a self-refresh mode, the self-refresh circuitry comprising circuitry to complete refresh operations for the current refresh row in all memory cell array banks upon entering self-refresh mode and before updating the current refresh row to a new row.

27. The memory device of claim 26, wherein the self-refresh circuitry comprises:
a bank address generator to generate a self-refresh bank address in a self-refresh mode; and
a first switch to select either the externally supplied bank address or the self-refresh bank address for a refresh operation.

28. The memory device of claim 27, wherein the first switch selects the self-refresh bank address in a self-refresh mode.

29. The memory device of claim 28, wherein the bank address generator sequentially generates a self-refresh bank address for each memory cell array bank upon entering self-refresh mode, prior to updating the current refresh row.

30. The memory device of claim 28, wherein the bank address generator sequentially generates a self-refresh bank address for each memory cell array bank that has not been addressed in a refresh operation for the current row upon entering self-refresh mode, prior to updating the current refresh row.

31. The memory device of claim 28, further comprising a set circuit to select all memory cell array banks for a first refresh operation upon entering self-refresh mode.

32. The memory device of claim 28, further comprising a set circuit to select all memory cell array banks that have not been addressed in a refresh operation for the current row for a first refresh operation upon entering self-refresh mode.

33. The memory device of claim 27, wherein the first switch selects the self-refresh bank address once the current refresh row is updated to a new row in self-refresh mode.

34. The memory device of claim 33, wherein prior to the first switch selecting the self-refresh bank address in self-refresh mode, the memory device continues to receive externally supplied bank addresses for refresh operations.

35. The memory device of claim 34, wherein the memory device continues to receive externally supplied bank addresses for refresh operations until all memory cell array banks that were not addressed in a refresh operation for the current row prior to entering self-refresh mode have been addressed in a refresh operation.

36. The memory device of claim 34, wherein the memory device receives n externally supplied bank addresses for refresh operations after entering self-refresh mode.

37. The memory device of claim 33, wherein the first switch operates in response to the output of the refresh bank address counter.

38. The memory device of claim 27, the self-refresh clock circuitry further comprising a self-refresh clock generator to supply a refresh clock signal for refresh operations in self-refresh mode, the self-refresh clock generator supplying refresh clock signals at a first rate until refresh operations for the current refresh row are completed for all memory cell banks, and supplying refresh clock signals at a second rate once the current refresh row is updated to a new row.

39. The memory device of claim 38, wherein the self-refresh clock generator comprises an auto refresh clock generator that is enabled upon entry to self-refresh mode and disabled once the current refresh row is updated to a new row, and a self refresh clock generator that is enabled in self-refresh mode once the auto refresh clock generator is disabled, the auto refresh clock generator having an output clock signal at the first rate, the self-refresh clock generator having an output clock signal at the second rate, the self-refresh clock generator having an output stage that ORs the output clock signals of the auto refresh clock generator and the self-refresh clock generator.

40. The memory device of claim 26, wherein the self-refresh circuitry comprises a set circuit to select all memory cell array banks for refresh operations after entering self-refresh mode.

41. The memory device of claim 35, wherein the set circuit comprises a delay circuit to delay a self-refresh clock, a NOR gate to receive the self-refresh clock and the delayed self-refresh clock, and a drive circuit to drive bank address lines for all memory cell array banks in response to the NOR gate output.

42. The memory device of claim 26, wherein the self-refresh circuitry comprises a set circuit to select all memory cell array banks that have not been addressed in a refresh operation for the current row for a first refresh operation upon entering self-refresh mode.

* * * * *

UNITED STATES PATENT AND TRADEMARK OFFICE
CERTIFICATE OF CORRECTION

PATENT NO.       : 7,164,615 B2                                           Page 1 of 1
APPLICATION NO.  : 11/169241
DATED            : January 16, 2007
INVENTOR(S)      : Taek-Seon Park et al.

It is certified that error appears in the above-identified patent and that said Letters Patent is hereby corrected as shown below:

Column 5, line 27, the word "12" should read -- I2 --;
Column 6, line 58, the word "13" should read -- I3 --;
Column 7, line 2, the words "13. The output of inverter 13" should read -- 13. The output of inverter I3 --.

Signed and Sealed this

Second Day of September, 2008

JON W. DUDAS
*Director of the United States Patent and Trademark Office*